(12) United States Patent  
Lee et al.

(10) Patent No.: US 8,169,128 B2  
(45) Date of Patent: May 1, 2012

(54) LED PACKAGE HAVING RECESS IN HEAT CONDUCTING PART

(75) Inventors: Seon Goo Lee, Kyungki-do (KR); Chang Ho Song, Seoul (KR); Kyung Taeg Han, Kyungki-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 215 days.

(21) Appl. No.: 11/500,361

(22) Filed: Aug. 8, 2006

(65) Prior Publication Data

US 2007/0030703 A1   Feb. 8, 2007

(30) Foreign Application Priority Data

Aug. 8, 2005   (KR) ................ 10-2005-0072435

(51) Int. Cl.  
*H01J 1/02* (2006.01)
(52) U.S. Cl. ..................................... 313/46; 362/800
(58) Field of Classification Search .......... 313/46, 313/483; 362/800; 257/81
See application file for complete search history.

(56) References Cited

U.S. PATENT DOCUMENTS

| 6,184,544 | B1 | 2/2001 | Toda et al. | |
| 6,274,924 | B1* | 8/2001 | Carey et al. | 257/676 |
| 2002/0163001 | A1* | 11/2002 | Shaddock | 257/79 |
| 2004/0041222 | A1* | 3/2004 | Loh | 257/433 |
| 2004/0075100 | A1 | 4/2004 | Bogner et al. | |
| 2006/0043401 | A1* | 3/2006 | Lee et al. | 257/99 |
| 2006/0220051 | A1* | 10/2006 | Fung et al. | 257/99 |

FOREIGN PATENT DOCUMENTS

| JP | 47-18474 | 9/1972 |
| JP | 53-108871 U | 8/1978 |
| JP | 64-011529 | 1/1989 |
| JP | 07-038154 | 2/1995 |
| JP | 11-214754 | 8/1999 |
| JP | 2000-261040 | 9/2000 |
| JP | 2001-185763 | 7/2001 |
| JP | 2004-119610 | 4/2004 |
| JP | 2004-521506 | 7/2004 |
| JP | 2005-079357 | 3/2005 |
| JP | 2005-116937 | 4/2005 |

OTHER PUBLICATIONS

Japanese Office Action, with English translation, issued in Japanese Patent Application No. 2006-214617, dated Mar. 2, 2010.  
Japanese Office Action, with English translation, issued in Japanese Patent Application No. 2006-214617, mailed Oct. 5, 2010.  
Japanese Office Action issued in Japanese Patent Application No. JP 2006-214617 dated Apr. 21, 2009.

* cited by examiner

*Primary Examiner* — Nimeshkumar Patel  
*Assistant Examiner* — Christopher Raabe  
(74) *Attorney, Agent, or Firm* — McDermott Will & Emery LLP

(57) ABSTRACT

The invention provides an LED package including an LED chip. In the LED package, a heat conducting part of folded sheet metals has a recess formed thereon to seat the LED chip therein. A package body houses the heat conducting part and directs light generated from the LED chip upward. Also, a transparent encapsulant is provided to at least the recess of the heat conducting part. Leads are partially housed by the package body to supply power to the LED chip. According to the invention, the sheet metals are folded to form the heat conducting part, and the recess is formed on the heat conducting part to seat the LED chip therein. This improves reflection efficiency and simplifies an overall process.

24 Claims, 26 Drawing Sheets

(a)

(b)

(a)

(b)

(a)

(b)

LED PACKAGE HAVING RECESS IN HEAT CONDUCTING PART

CLAIM OF PRIORITY

This application claims the benefit of Korean Patent Application No. 2005-72435 filed on Aug. 8, 2005 in the Korean Intellectual Property Office, the disclosure of which is incorporated herein by reference.

BACKGROUND OF THE INVENTION

1. Field of the Invention

The present invention relates to a light emitting diode (LED) package, more particularly, which has a heat conducting part comprised of folded sheet metals and a recess formed thereon to seat an LED chip therein, thereby enhancing reflection efficiency and simplifying an overall process.

2. Description of the Related Art

An LED is a semiconductor apparatus for generating multi-color light when current is supplied. The color of light generated from the LED is largely determined by chemical components of the LED semiconductor. The LED is more advantageous than a filament-based light emitting device, thus exhibiting a longer useful life, a low voltage, excellent initial driving properties, high vibration resistance and higher tolerance against repetitive power switching, and the like. Accordingly, demand for the LED has been steadily rising.

Recently the LED is employed in a lighting device and a backlight device for a large-scale Liquid Crystal Display (LCD). Due to a big output requirement of the devices, the LED needs to have a package structure with superior heat release properties.

FIG. 1(a) is a view illustrating a conventional LED package, and FIG. 1(b) is a view illustrating the LED package mounted on a circuit board.

First, referring to FIG. 1(a), the LED package 10 includes a heat slug or heat conducting part 14 which has an LED chip 12 mounted therein and serves to guide heat. The LED chip 12 is supplied with electricity from external power (not illustrated) through a pair of wires 16 for supplying power and a pair of terminals 18. An upper part of the heat conducting part 14 including the LED chip 12 is encapsulated by an encapsulant 20 generally made of silicone. The encapsulant 20 is covered with a lens 22. A housing 24 is formed around the heat conducting part 14 typically by molding, thereby supporting the heat conducting part 14 and the terminals 18.

The LED package 10 of FIG. 1(a) is mounted on a circuit board 30 which is a heat sink to constitute an LED assembly 40. Here, a heat conductive pad 36 such as a solder is inserted between the heat conducting part 14 of the LED package 10 and a heat releasing metal substrate 32 of the circuit board 30, thus facilitating heat conductivity therebetween. Moreover, the terminals 18 are solidly connected to a circuit pattern 34 of the circuit board 30 via a solder 38.

The LED package 10 and the LED assembly 40 having the LED package mounted on the circuit board 30 as shown in FIG. 1 are aimed to release heat to a great extent. That is, for the LED package 10 to absorb heat generated from the LED chip 12 and release it to the outside, the heat sink, i.e., the heat conducting part 14 is connected to a heat releasing substrate 32 of the circuit board 30 either through a heat conductive pad 36 or directly. This allows heat generated in the LED chip 12 to be mostly conducted through the heat conducting part 14 to the heat releasing substrate 32 of the circuit board 30. Only a small portion of heat is released into the air through the surface of the LED package, i.e., the housing 24 or the lens 22.

However, such a conventional heat releasing structure is too complicated to be automated and necessitates assembling of too many parts and components. This disadvantageously increases production cost.

FIG. 2 illustrates an LED lead frame structure disclosed in U.S. Patent Application Publication No. 2004/0075100. FIG. 2 depicts a lead frame 2 and a heat conducting part 4. The lead frame 2 is separated into two electric connecting parts 12a and 12b, which are connected to respective solder connecting strips 3a and 3b.

The first electric connecting part 12a has an eye-shaped opening into which the heat conducting part 4 is inserted. The heat conducting part 4 is substantially rotationally symmetric and has protrusions formed thereon to ensure the lead frame is solidly fixed inside a housing. The heat conducting part 4 has a recess formed in the center thereof to serve as a reflector 16. Also, on a bottom surface of the heat conducting part 4, a chip mounting area 11 is provided to support a light releasing chip, which is the LED chip. A side of the recess functions as a reflecting surface.

The eye-shaped opening of the first electric connecting part 12a has a cut 13 abutting a tongue-shaped bonding wire connecting area 10 of the second electric connecting part 12b. The bonding wire connecting area 10 is disposed at a height different from that of an outer periphery of the reflector 16 for emitting light. This structure obviates a need for cutting out the outer periphery of the reflector 16 to seat a chip but allows the chip and the bonding wire connecting area 10 to be connected via a short wire.

Meanwhile, reference sign 27 denotes a light emitting direction.

Such a lead frame structure allows a package body to be molded of resin with the first electric connector 12a inserted into the heat conducting part 4. Therefore, this ensures a simpler manufacturing process than the package structure explained with reference to FIG. 1.

But this lead frame structure is disadvantageously limited to a case where the electric connecting part 12a and the heat conducting part 4 are electrically connected with each other, as the first electric connecting part 12a is in direct contact with the heat conducting part 4. That is, such a structure cannot be employed in a case where the electric connecting part 12a and the heat conducting part 4 are insulated from each other.

Also, the heat conducting part 4 and the electric connecting part 12a are necessarily assembled together due to their separate manufacturing. Moreover, the assembled heat conducting part 4 and the electric connecting part 12a are separated from each other and electrodes are easily shorted when external impact is applied.

SUMMARY OF THE INVENTION

The present invention has been made to solve the foregoing problems of the prior art and therefore an object according to certain embodiments of the present invention is to provide an LED package which has a heat conducting part of folded sheet metals and a recess formed on the heat conducting part to seat an LED chip therein, thereby boosting reflection efficiency and simplifying an overall process.

Another object according to certain embodiments of the invention is to provide an LED package which has a heat conducting part comprised of folded sheet metals and a recess formed thereon to seat an LED chip therein, thereby easily obtaining the recess in various structures.

According to an aspect of the invention for realizing the object, there is provided a light emitting diode package comprising: a light emitting diode chip; a heat conducting part comprising folded sheet metals, the heat conducting part having a recess formed thereon to seat the light emitting diode chip therein; a package body for directing light generated from the light emitting diode chip upward, the package body housing the heat conducting part and; a transparent encapsulant provided to the recess of the heat conducting part; and leads partially housed by the package body to supply power to the light emitting diode.

In the LED package of the invention, preferably, the package body has a recess formed over the recess of the heat conducting part to partially expose an upper surface of the heat conducting part, wherein the transparent encapsulant is also provided to the recess of the package body.

Preferably, the heat conducting part is formed integrally with one of the leads.

In the LED package of the invention, preferably, the heat conducting part further comprises a coupling part for coupling folded portions of the heat conducting part, the connector formed between the folded portions.

Preferably, the connector comprises a weld or a metal inclusion. The weld is formed by at least one selected from a group consisting of resistance welding, hot press welding, ultrasonic welding and high frequency welding. Also, preferably, the metal inclusion comprises a coating material or a metal paste.

In the LED package of the invention, preferably, the recess of the heat conducting part comprises a hole formed in an upper one of the folded sheet metals of the heat conducting part.

Preferably, the recess of the heat conducting part comprises a concave formed in an upper one of the folded sheet metals of the heat conducting part.

Moreover, in the LED package of the invention, preferably, a path is formed in a portion around the light emitting diode chip of the heat conducting part and a portion of the package body adjacent thereto, the path leading from the recess of the heat conducting part to an upper surface of at least one of the electric connecting parts, wherein the light emitting diode chip is connected to the upper surface of the electric connecting part via a wire through the path. The transparent encapsulant is also provided to the path. At this time, the package body comprises a recess formed over and around the recess of the heat conducting part to partially expose an upper surface of the heat conducting part, wherein the light emitting diode package further comprises a second transparent encapsulant provided to the recess of the package body.

In the LED package of the invention, an upper part of the package body above the leads is shaped such that the light emitting diode chip and the leads are electrically connected, the upper part extending to an outer periphery of the heat conducting part.

In the LED package of the invention, the transparent encapsulant is shaped as an upper hemisphere.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
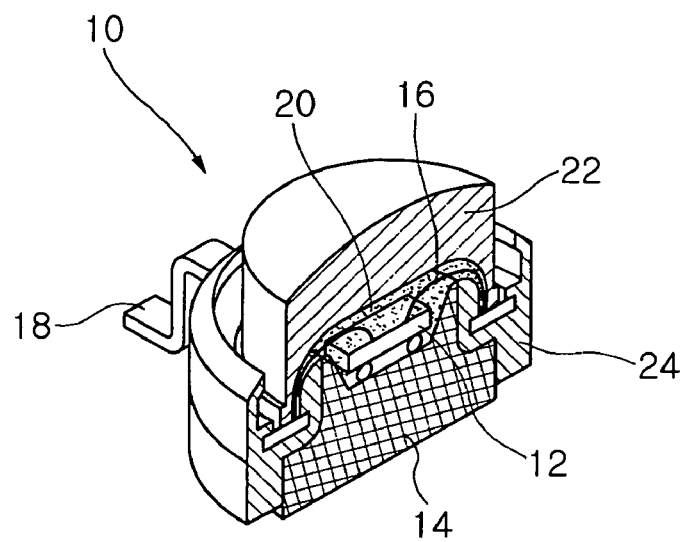
FIG. 1 illustrates a conventional LED package and a mounting structure of this LED package.
Figure 1:
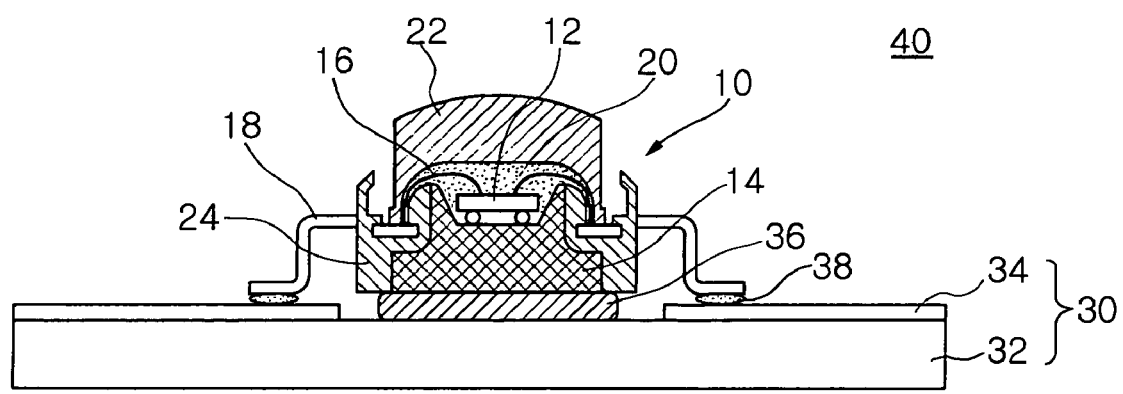
Figure 2:
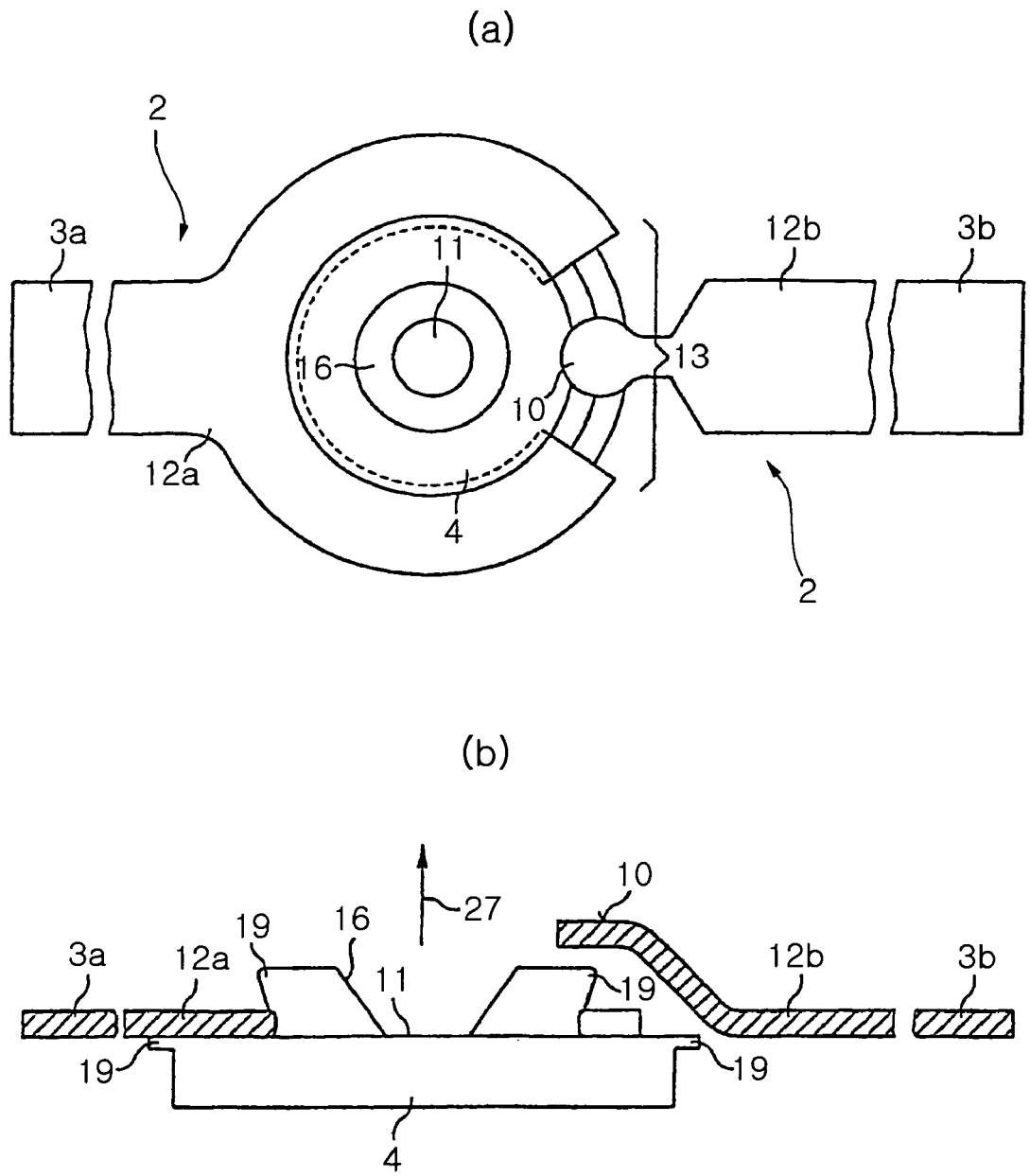
FIG. 2 illustrates a lead frame structure of the conventional LED package.
Figure 3:
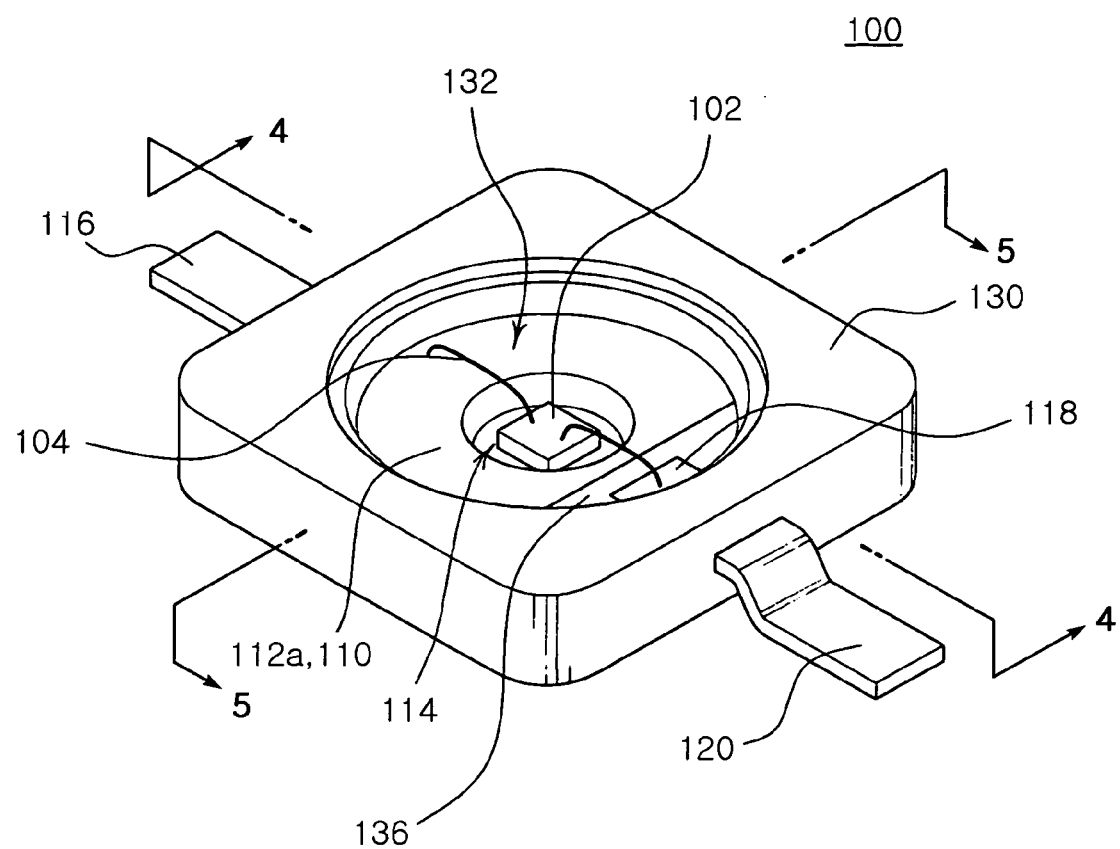
FIG. 3 is a perspective view illustrating an LED package according to an embodiment of the invention.
Figure 4:
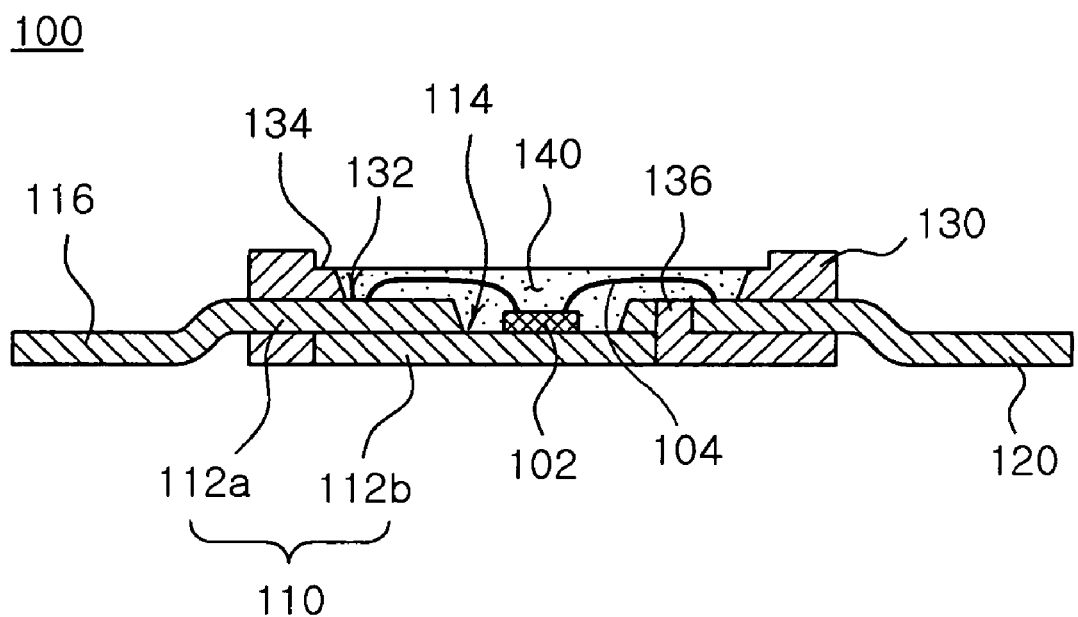
FIG. 4 is a cross-sectional view cut along the line 4-4 of FIG. 3.
Figure 5:
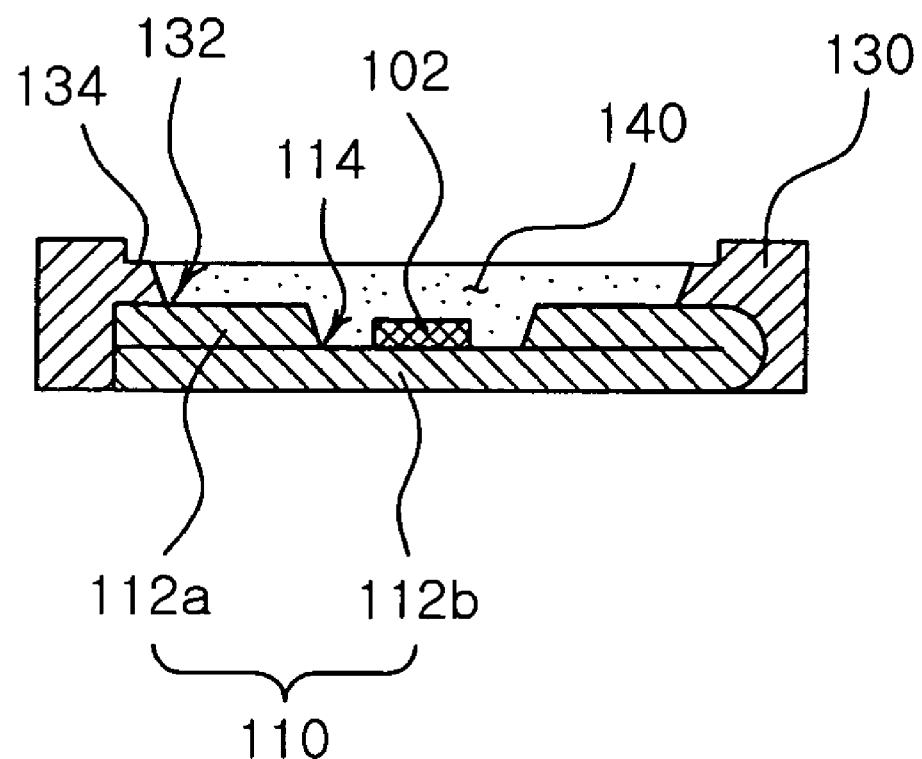
FIG. 5 is a cross-sectional view cut along the line 5-5 of FIG. 3.
Figure 6:
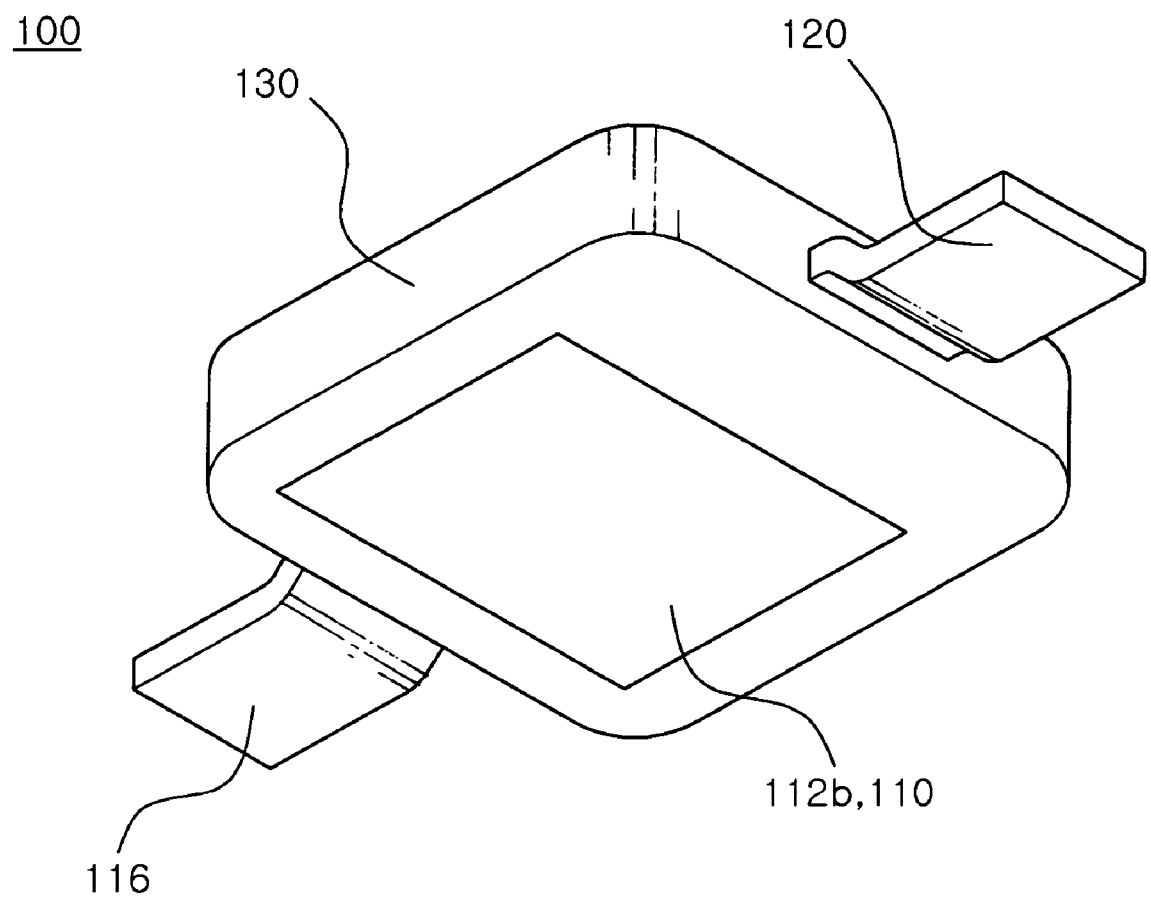
FIG. 6 is a bottom perspective view illustrating an LED package of the invention.

First, an LED package according to an embodiment of the invention will be explained hereunder with reference to FIGS. 3 to 6, in which FIG. 3 is a perspective view illustrating the LED package having a recess formed thereon according to an embodiment of the invention, FIG. 4 is a cross-sectional view cut along the line 4-4 of FIG. 3, FIG. 5 is a cross-sectional view cut along the line 5-5 of FIG. 3, and FIG. 6 is a bottom perspective view illustrating the LED package of FIG. 3.

The LED package 100 includes a heat conducting part 110, a package body 130, a transparent encapsulant 140. The heat conducting part 110 is comprised of folded sheet metals 112a and 112b and has a recess 114 formed thereon to seat the LED chip therein. The package body 130 houses the heat conducting part 110 and has a recess 132 for directing light generated from the LED chip upward. Also, the transparent encapsulant 140 is provided into the recess 114 of the heat conducting part 110 and the recess 132 of the package body 130 to encapsulate the LED chip 102.

As shown in FIG. 5, to form the heat conducting part 110, a pair of sheet metals 112a and 112b are folded over and then bonded together. A suitable metal inclusion is inserted between the sheets 112a and 112b to bond them together. Alternatively, the sheets 112a and 112b are welded together. The metal inclusion may adopt a coating material or a paste. Examples of welding include resistance welding, hot press welding, ultrasonic welding and high-frequency welding. For welding, a weld (not illustrated) is formed entirely or partially on contacting areas or adjacent areas of the sheet metals 112a and 112b. The weld couples the sheet metals 112a and 112b together.

A hole is perforated in the upper sheet metal 112a to form the recess 114 of the heat conducting part 110. A bottom surface of the recess 114 is formed by a portion of the lower pate metal 112b so that light generated from the LED chip 102 is reflected upward by the metal recess 114. Meanwhile, a portion of the upper sheet metal 112a is extended outside the package body 130 to form a first lead 116. Also, an underside surface of the lower sheet metal 112b is not housed by the package body 130, thereby exposed to the outside as shown in FIG. 6.

A second lead 120 is partially disposed inside the package body 130 to form an electric connecting part 118 and insulated from the heat conducting part 110 by a portion 136 of the package body 130.

Further, the LED chip disposed in the recess 114 of the heat conducting part 110 is connected to the upper sheet metal 112a of the heat conducting part 110 via one of wires 104. The upper sheet metal 112a is integral with the first lead 116, thereby serving as the electric connecting part. In addition, the LED chip 102 is connected to the electric connecting part 118 of the second lead 120 via the other one of the wires 104.

The package body 130 has the recess 132 formed above from the center and a seating part 134 formed around the recess 132. The seating part 134 is preferably coplanar with an upper surface of the transparent encapsulant 140. This allows the seating part 134 to support a bottom surface of a cover, which is placed over the transparent encapsulant 140 in a later process. The package body 130 is typically molded of an opaque or high reflectivity resin. Preferably, the package body 130 is made of a polymer resin which is easily injected. But materials for the package body 130 are not limited thereto but may include a variety of resins.

The recess 114 of the heat conducting part 110 and the recess 132 of the package body 130 are filled with the transparent encapsulant 140. The transparent encapsulant 140 is made of a high transparent resin capable of transmitting light generated from the LED chip 102 with minimum loss. Preferably, an elastic resin is adopted for the transparent encapsulant 140. The elastic resin, which is a gel-type resin such as silicone, hardly suffers transformation by short wavelength light such as yellowing and exhibits high reflectivity, thus resulting in superior optical properties. Also, unlike epoxy, the elastic resin remains in a gel or elastomer state even after curing, thereby protecting the LED chip 102 more stably from heat-induced stress, vibration and external impact.

Moreover, the transparent encapsulant 140 is filled in a liquid state in the recesses 114 and 132 and then cured. As a result, internal air bubbles are exposed to an ambient atmosphere during curing, and thus advantageously discharged outside smoothly.

Here, resin for the transparent encapsulant 140 may contain an ultraviolet absorbent for absorbing ultraviolet ray generated from the LED chip 102 or a fluorescent material for converting monochromatic light into white light.

In this fashion, the heat conducting part 110 is comprised of the upper and lower sheet metals 112a and 112b and a hole is perforated in the upper sheet metal 112a to form the recess 114. This allows light generated from the LED chip 102 to be effectively reflected upward. Furthermore, the sheet metals 112a and 112b are doubled over to easily form the heat conducting part 110, which thus simplifies an overall process. Also, the heat conducting part 110 is formed integrally with the first lead 116, thereby advantageously hardly separated from each other despite external impact.

Figure 7:
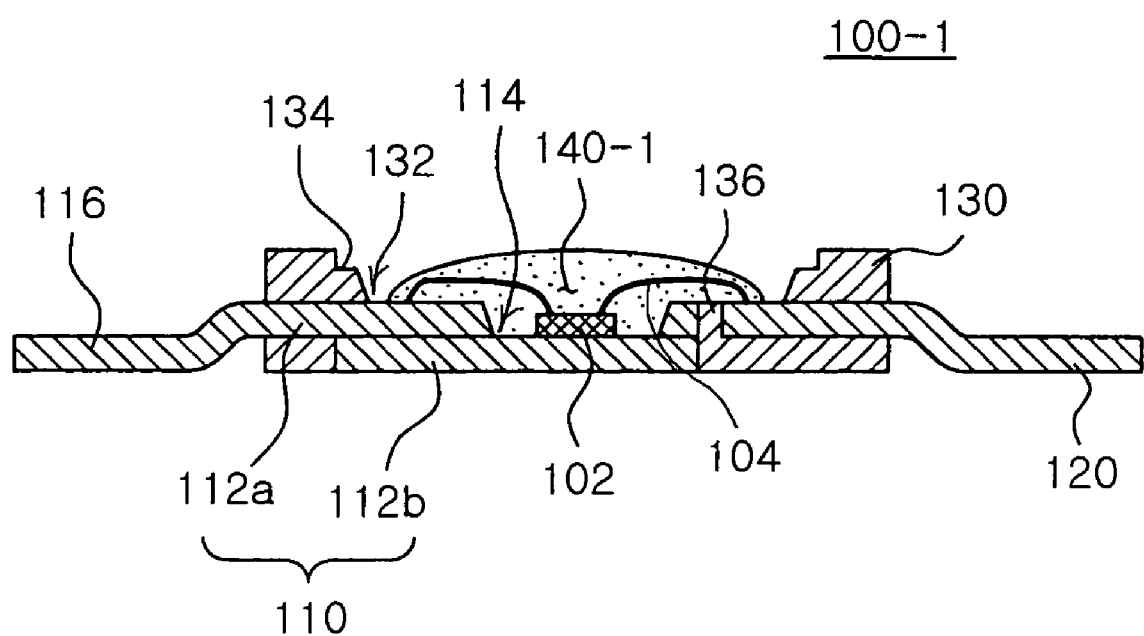
FIG. 7 is a cross-sectional view illustrating an alternative to the LED package according to the invention.

FIG. 7 is a cross-sectional view illustrating an alternative to the LED package according to the invention.

As shown in FIG. 7, the LED package 100-1 in a modified example is identical to the aforesaid LED package 100 except that in the LED package 100-1, a transparent encapsulant 140-1 is hemispherical. Therefore, the same or corresponding components were given the same reference signs and will not explained further.

Meanwhile, the encapsulant 140 may feature various shapes such as a hemisphere, a dome and an ellipsoid. The encapsulant 140 is not limited in its height but preferably not higher than the package body 130.

The encapsulant 140 is made of a transparent resin having thixotropy capable of maintaining a certain shape when dispensed. Preferably, the encapsulant 140 adopts JCR6101up available from Dow Corning Corp. Also, as a dispenser for precisely dispensing the resin into the recess, ML-808FX available from Musashi Corp. may be used. This apparatus enables a precisely-controlled dotting of even about 0.03 cc.

Also, in this LED package 100-1, a heat conducting part 110 is formed of upper and lower sheet metals 112a and 112b and a hole is perforated in the upper sheet metal 112a to form a recess 114 so that light reflected from an LED chip 102 is effectively reflected upward. Also, the sheet metals 112a and 112b are folded over to easily obtain a heat conducting part 110, thereby simplifying an overall process. In addition, the heat conducting part 110 and the first lead 116 are formed integrally, thereby advantageously hardly separated from each other even despite external impact applied.

Figure 8:
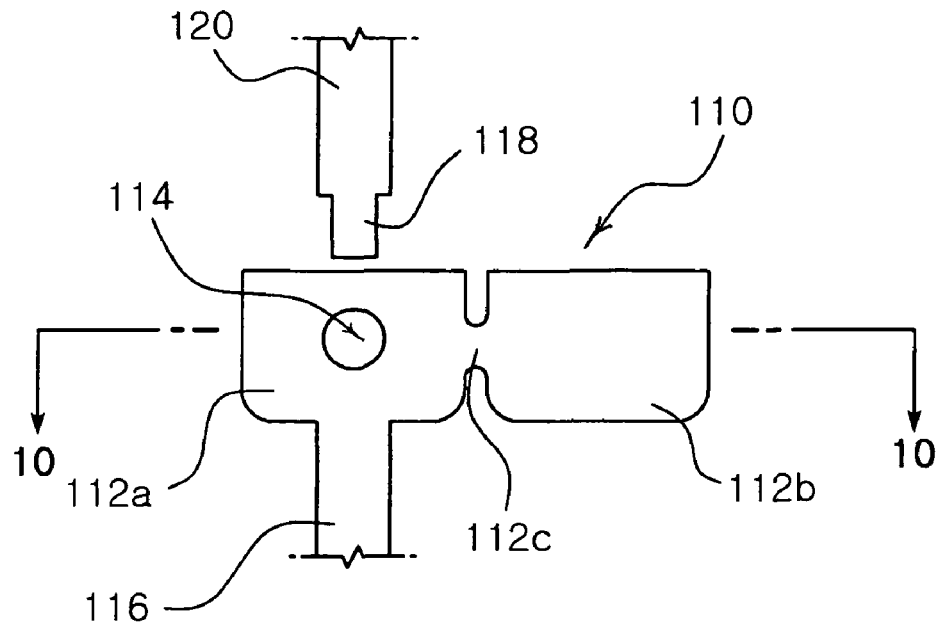
FIGS. 8 and 9 are top views illustrating in a stepwise fashion a process for manufacturing the LED package according to the invention.
Figure 8:
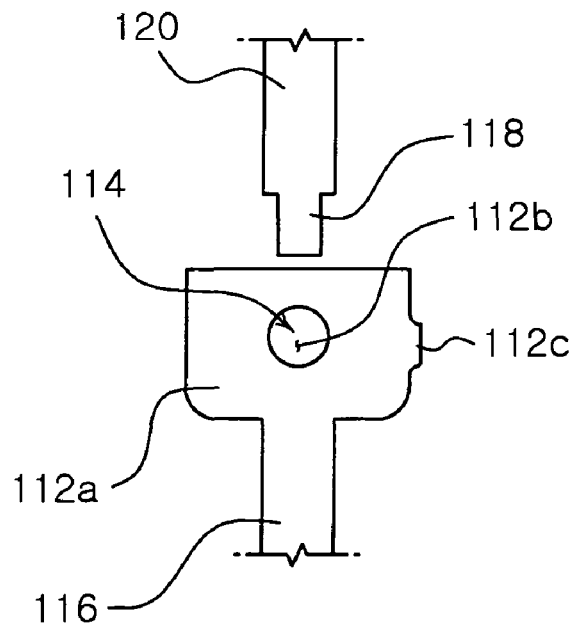
Figure 9:
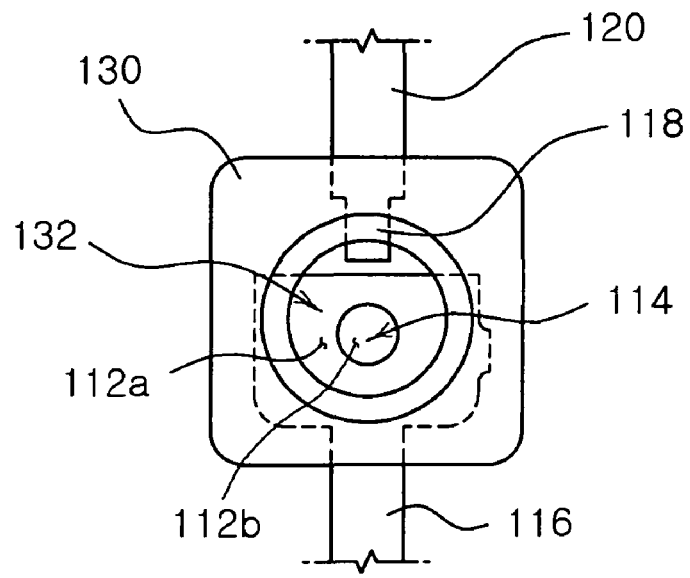
Figure 9:
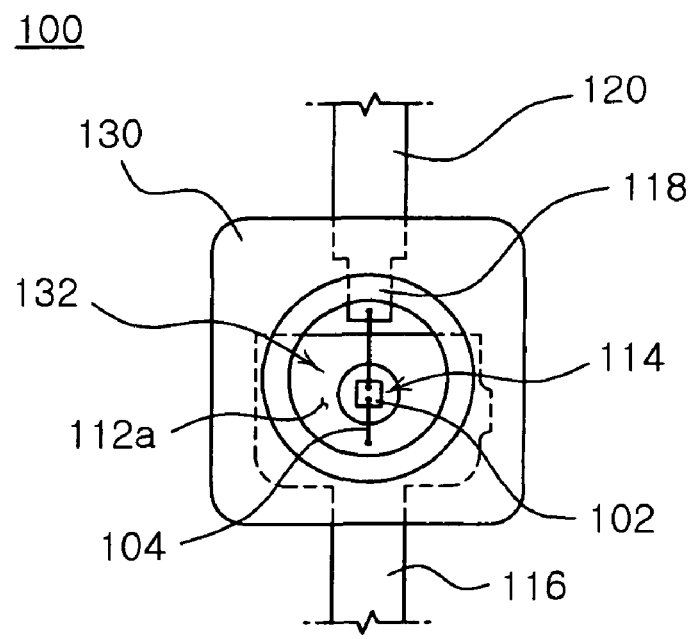
Figure 10:
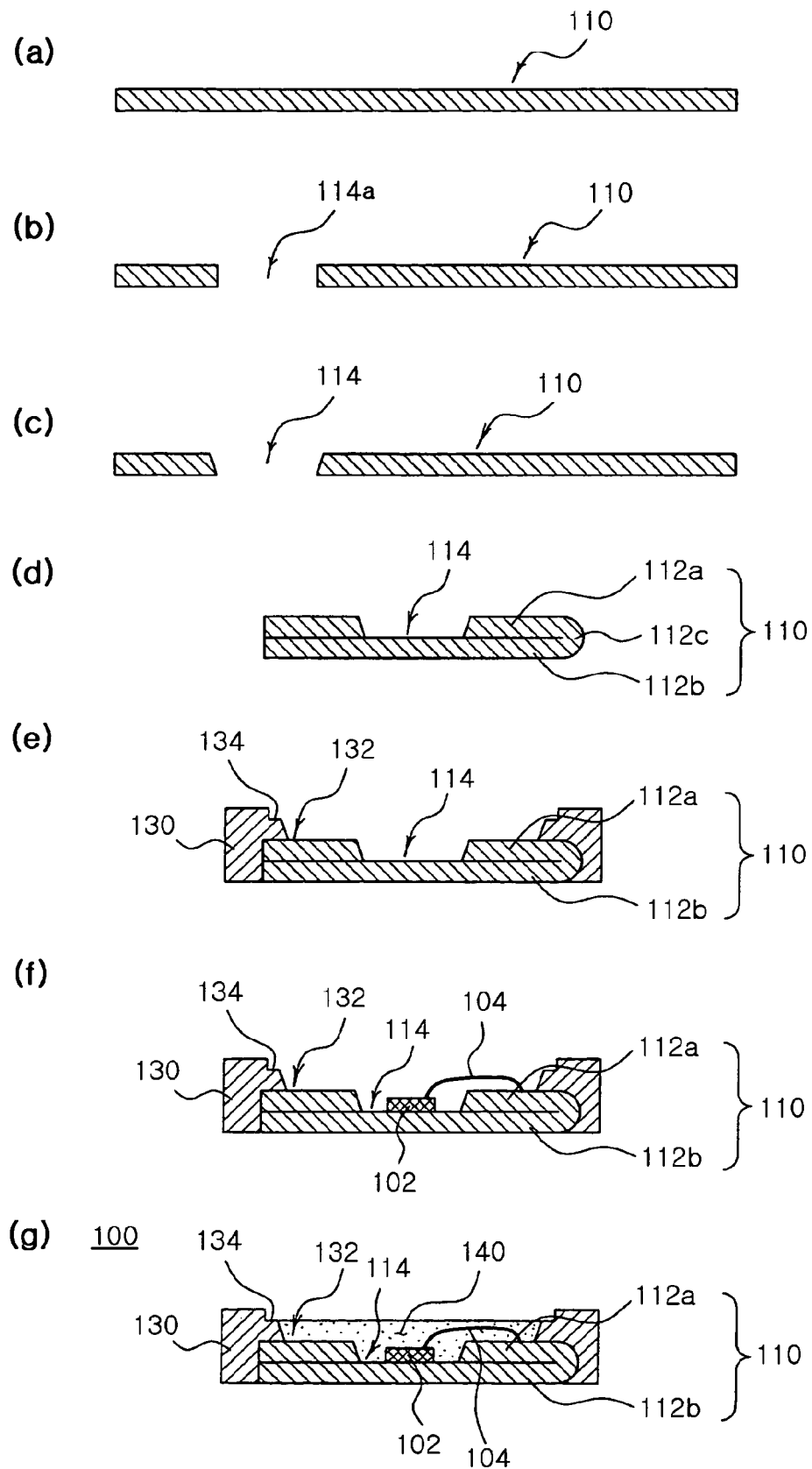
FIG. 10 is a cross-sectional view illustrating in a stepwise fashion a process for manufacturing an LED package according to an embodiment of the invention.

A process for manufacturing an LED package according to the invention will be explained hereunder with reference to FIGS. 8 to 10, in which FIGS. 8 and 9 are top views illustrating in a step wise fashion a process for manufacturing the LED package according to the invention, and FIG. 10 is a cross-sectional view illustrating in a step wise fashion a process for manufacturing the LED package according to an embodiment of the invention.

As shown in FIG. 8(a), a heat conducting part 110 is comprised of a pair of sheet metals 112a and 112b, and a connector 112c. The heat conducting part 110 is integrally connected to a first lead 116. An electric connecting part 118 of a second lead 120 is disposed opposing the sheet metal 112a at a predetermined gap.

To form the heat conducting part 110, first, as shown in FIG. 10(a), a sheet metal is prepared for the heat conducting part 110 and a hole 114a is perforated in a predetermined area via punching and the like as shown in FIG. 10(b). Thereafter, as shown in FIG. 10(c), the hole 114a is remachined to form a recess 114. Of course, the recess 114 may be formed to a desired shape. FIG. 8(a) is a top view illustrating the heat conducting part 110 obtained. That is, FIG. 10(*c*) is a cross-sectional view illustrating the heat conducting part 110 of FIG. 8(*a*).

Next, as shown in FIGS. 8(*b*) and 10(*d*), the sheet metals 112*a* and 112*b* are folded over with respect to a coupling part 112*c* and the folded portions are coupled together via welding or a metal inclusion. Examples of welding include resistance welding, hot press welding, ultrasonic welding and high frequency welding. The metal inclusion adopts a coating material or a paste.

Then, mold (not illustrated) is placed around the heat conducting part 110 and the electric connecting part 118 and resin is injected thereinto to form a package body 130 as shown in FIGS. 9(*a*) and 10(*e*). The package body 130 is identical to the aforesaid package body of FIGS. 4 and 5. The package body 130 is typically molded of an opaque or high reflectivity resin. Preferably, the package body 130 is formed of a polymer resin which is easily injected.

Thereafter, as shown in FIGS. 9(*b*) and 10(*f*), an LED chip 102 is mounted in the recess 114 of the heat conducting part 110. The heat conducting part 110 is connected to the electric connecting part 118 via wires 104.

Next, a transparent resin is filled in a recess 132 of the package body and then cured to obtain an LED package 100 according to the invention. The LED package 100 is identical in its structure to those shown in FIGS. 3 to 6.

Meanwhile, a transparent encapsulant 140 is made of a high transparent resin capable of transmitting light generated from the LED chip 102 with minimum loss. Preferably, the transparent encapsulant 140 is exemplified by an elastic resin. The elastic resin employed may be of the same kind as that described above with reference to FIGS. 3 to 6, thus demonstrating the same characteristics and advantages.

As described above, the sheet metals are partially perforated to form the recess 114 to seat the LED chip therein. Also, the sheet metals are doubled over to easily produce the heat conducting part 110. Moreover, mold is placed around the heat conducting part 110 to form the package body 130 via injection molding. Then an LED chip is mounted in the recess of the heat conducting part 110 and a transparent resin is poured therein to form an encapsulant 140. Consequently an overall process for manufacturing the LED package becomes simpler.

Figure 11:
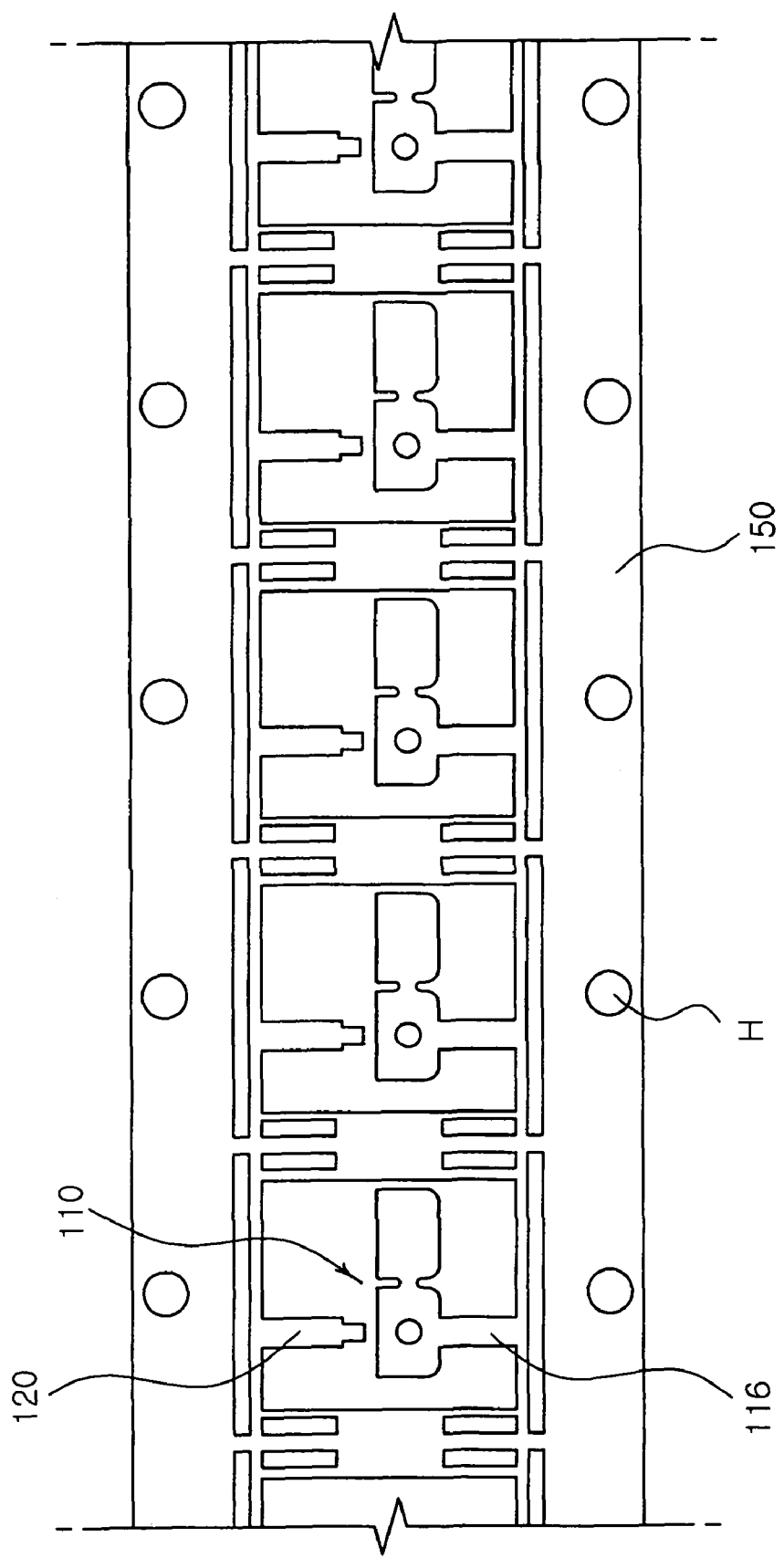
FIG. 11 is a top view illustrating a frame sheet used in the manufacturing process of the LED package of the invention.
Figure 12:
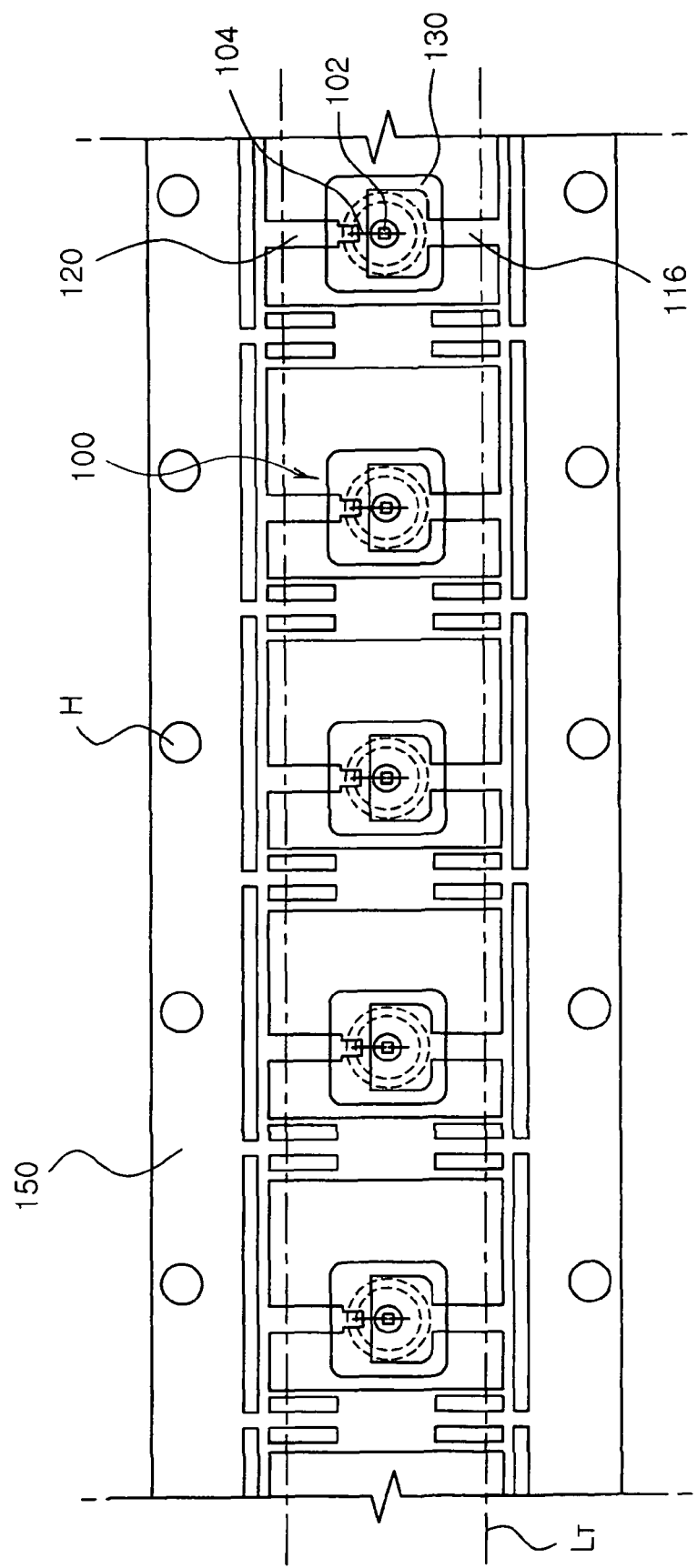
FIG. 12 is a top view illustrating a step of the manufacturing process of the LED package via the frame sheet corresponding to FIG. 9(b)

A process for mass-producing an LED package 100 of the invention will explained hereunder with reference to FIGS. 11 and 12, in which FIG. 11 is a top view illustrating a frame sheet used in the manufacturing process of the LED package of the invention and FIG. 12 illustrates a step of a manufacturing process of the LED package using the frame sheet, corresponding to FIG. 9(*b*).

First, the frame sheet 150 as shown in FIG. 11 is prepared. The frame sheet 150 has a plurality of holes H perforated in a longitudinal periphery thereof. The holes H serve to guide and anchor the overall structure. Also, the frame sheet 150 has a plurality of heat conducting parts 110 and a plurality of leads 120 as shown in FIG. 8(*a*). Therefore, with the processes of FIGS. 9 to 11 applied to the frame sheet 150, the LED package 100 of the invention can be mass-produced.

FIG. 12 illustrates a frame sheet 150 having a plurality of LED packages 100 formed therein. The frame sheet 150, when cut along a trimming line LT, produces the plurality of unit LED packages 100.

Optionally, prior to FIGS. 9(*b*) and 10(*f*), first and second leads 116 and 120 are cut along a trimming direction LT.

In this fashion, the LED package 100 of the invention can be mass-produced via the frame sheet 150, thereby enhancing work efficiency and noticeably reducing the unit price.

Figure 13:
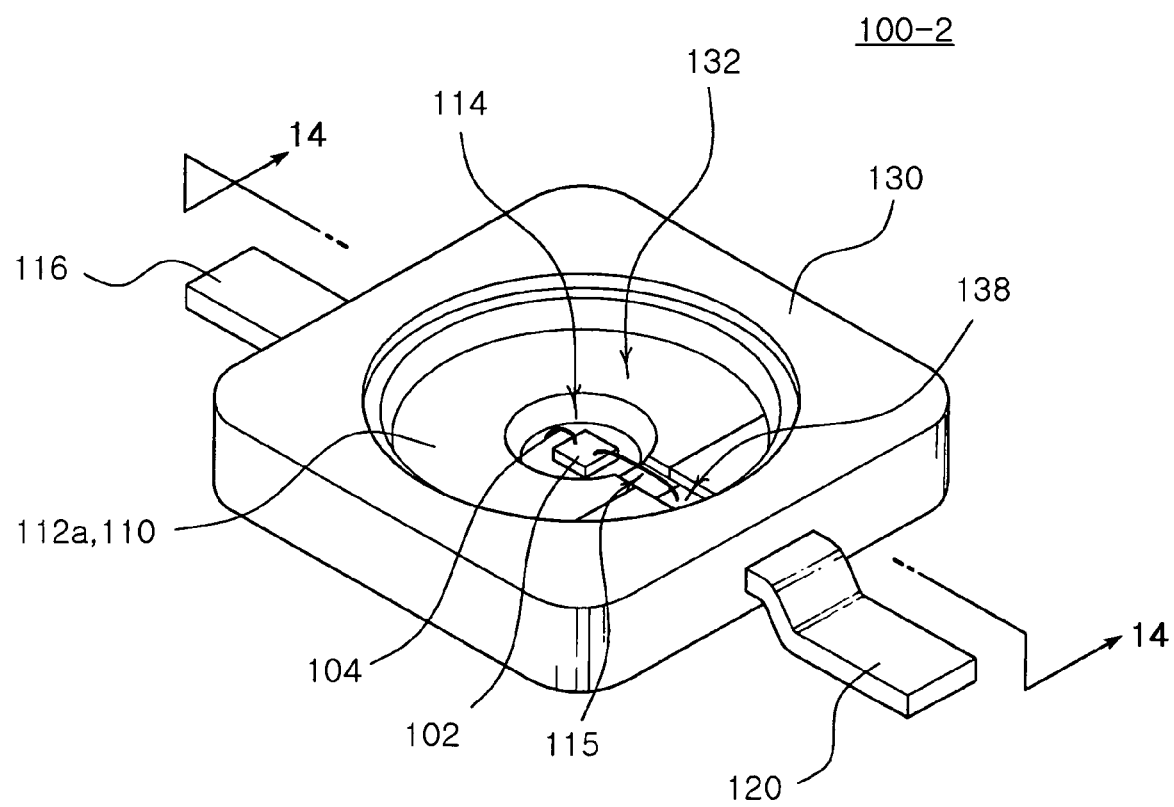
FIG. 13 is a perspective view illustrating an LED package according to another embodiment of the invention.
Figure 14:
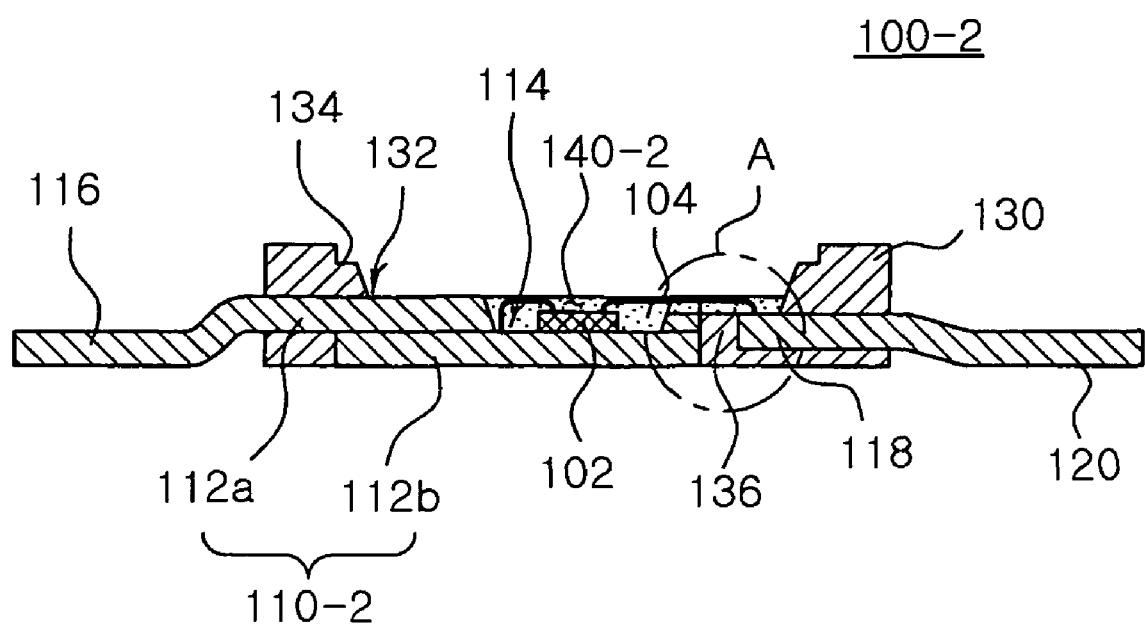
FIG. 14 is a cross-sectional view cut along the line 14-14 of FIG. 13.
Figure 15:
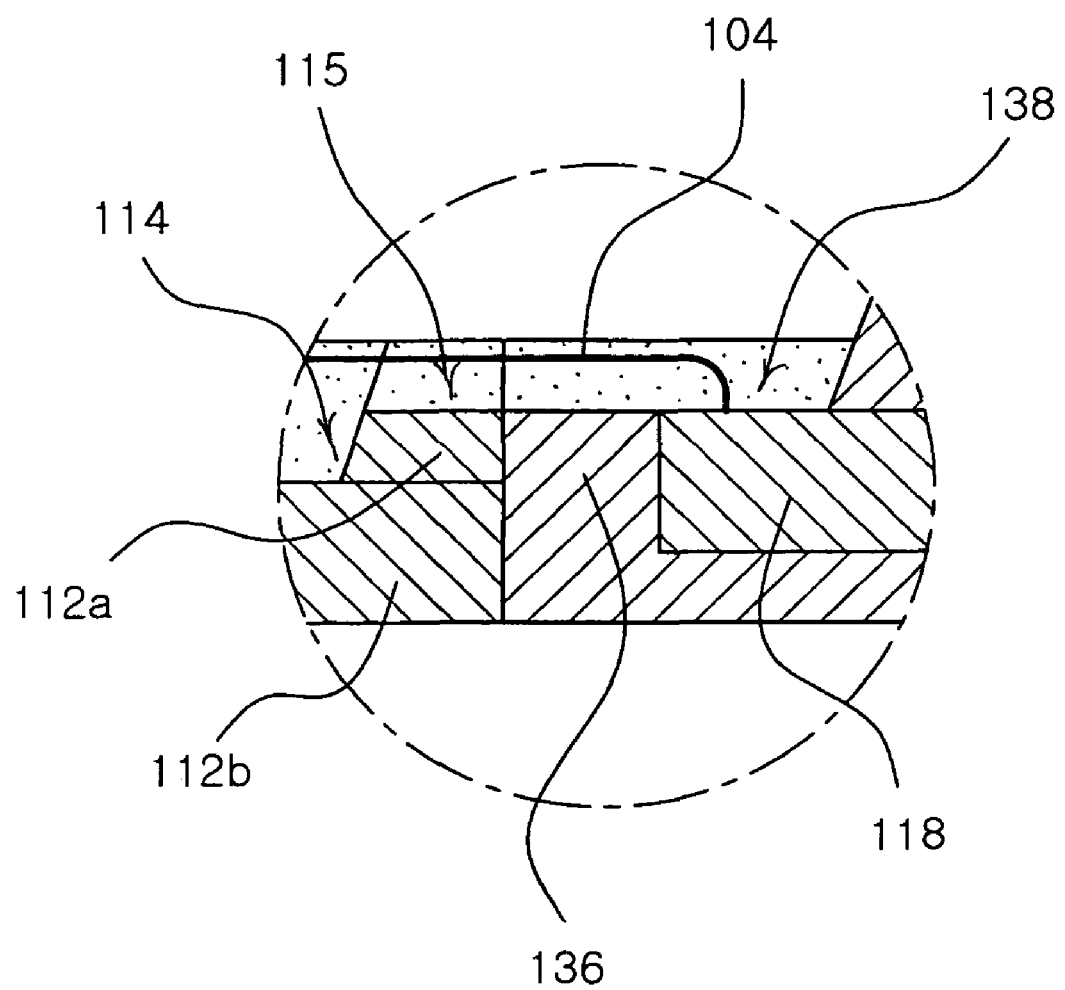
FIG. 15 is a magnified view illustrating an A portion of FIG. 14.

An LED package according to another embodiment of the invention will be explained hereunder with reference to FIGS. 13 to 15, in which FIG. 13 is a perspective view illustrating the LED package according to another embodiment of the invention, FIG. 13 is a perspective view illustrating the LED package according to further another embodiment of the invention, FIG. 14 is a cross-sectional view cut along the line 14-14 of FIG. 13, and FIG. 15 is a magnified view illustrating an A portion of FIG. 14.

The LED package 100-2 according to this embodiment of the invention is substantially identical to the aforesaid LED package 100. The only difference is that in the LED package 100-2, one of wires 104 is connected to a heat conducting part 110 on a bottom surface of a recess 114 and the other one of the wires 104 is connected to an electric connecting part 118 of a second lead 120 through a path 115 of an upper sheet metal 112*a* and a path 138 leading therefrom to the package body 130. Therefore, the same or corresponding components were given the same reference signs and will not explained further.

In such an LED package 100-2, the wires 104 can be installed lower than an upper surface of the upper sheet metal 112*a* of the heat conducting part 110. Accordingly, a transparent encapsulant 104-2, when formed only in a recess 114 of the heat conducting part 110, the path 115 and the path of the package body 130, can sufficiently encapsulate the LED chip 102 and the wires 104.

This advantageously allows light generated from the LED chip 102 to be emitted upward more effectively.

Furthermore, the transparent encapsulant 140-2 may contain an ultraviolet absorbent for absorbing ultraviolet ray generated by the LED chip 102 or a fluorescent material for converting monochromatic light into white light.

Of course, a transparent resin may be poured again into a recess 132 over the transparent encapsulant 140-2 to form a second transparent encapsulant.

Figure 16:
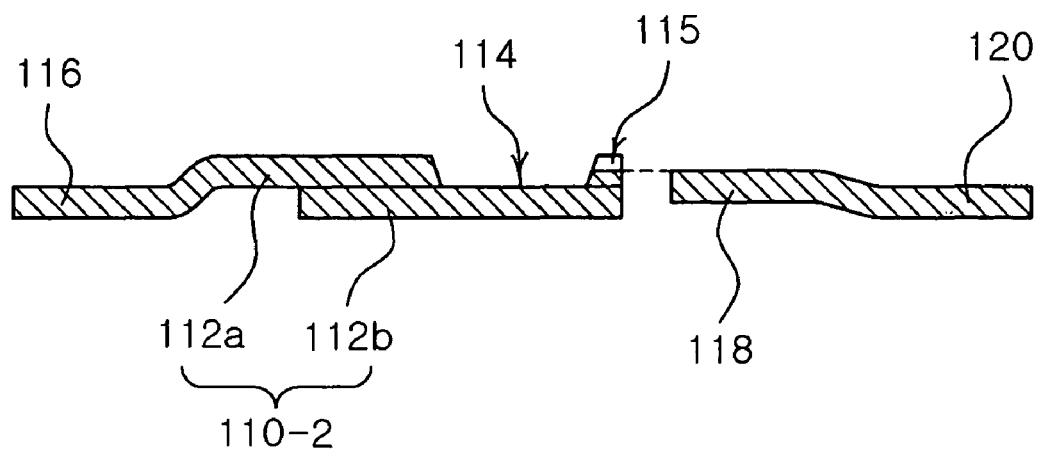
FIG. 16 is a cross-sectional and top view illustrating partial steps of the manufacturing process of the LED package according to further another embodiment of the invention.
Figure 16:
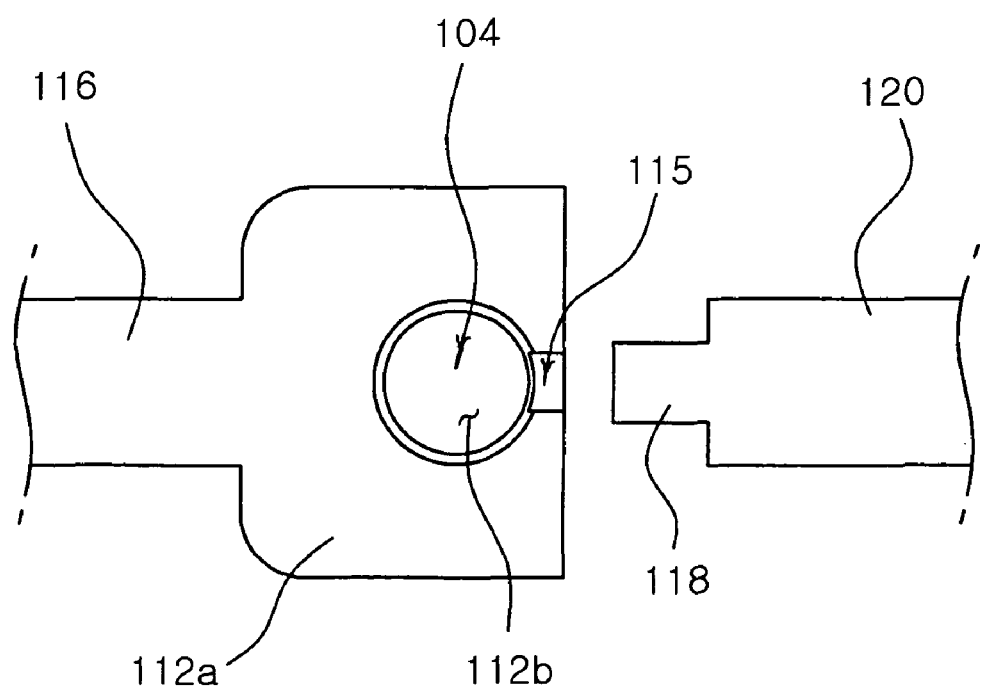

A process for manufacturing an LED package 100-2 according to the invention will be explained hereunder with reference to FIG. 16 together with FIGS. 8 to 10 described above. FIG. 16 is a cross-sectional and top view illustrating partial steps in a manufacturing process of the LED package according to further another embodiment of the invention.

A heat conducting part 110-2, a first lead 116 and a second lead 120 shown in FIGS. 16(*a*) and (*b*) are obtained by corresponding processes of FIGS. 8(*a*) and 8(*b*) and FIGS. 10(*a*) and (*d*). Here, an electric connecting part 118 of the second lead 120 is disposed at a mid height of the heat conducting part 110-2. Also, in the second lead 120 of an upper sheet metal 112*a* of the heat conducting part 110-2, a path 115 is coplanar with an upper surface of the electric connecting part 118.

When the heat conducting part 110-2 and the first and second leads 116 and 120 are formed as described above, later processes are substantially identical to those of FIGS. 9(*a*) and (*b*) and FIG. 10(*e*) to (*g*). However, unlike the step of forming the transparent encapsulant in FIG. 10(*g*), a transparent encapulant 140-2 according to this embodiment is provided to only a recess 114 of the heat conducting part 110, a path 115 and a path 138 of the package body 130.

Figure 17:
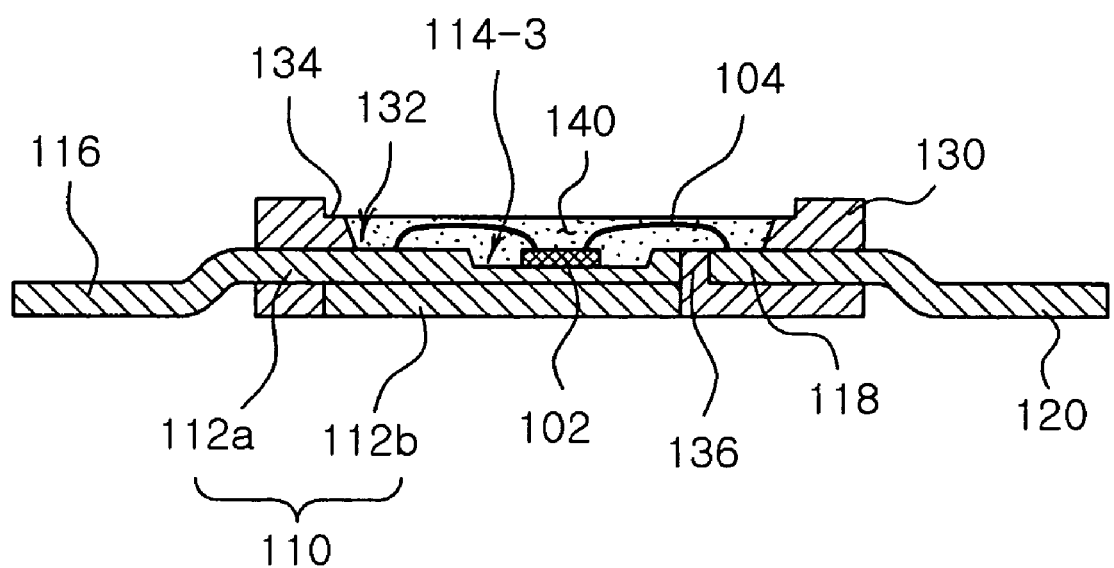
FIG. 17 is a cross-sectional view illustrating an LED package according to further another embodiment of the invention, in a cross section corresponding to FIG. 4.

An LED package 100-3 according to further another embodiment of the invention will be explained hereunder with reference to FIG. 17, which is a cross-sectional view illustrating the LED package 100-3 according to the embodiment of the invention, corresponding to FIG. 4.

The LED package 100-3 of this embodiment is distinct from the aforesaid LED package 100 only in that a recess 114-3 of a heat conducting part 110 is formed of only an upper sheet metal 112 in the LED package 100-3. That is, in the aforesaid LED package 100, the hole is perforated in the upper sheet metal 112*a* to form the recess 114 so that an upper surface of the lower sheet metal 112*b* partially constitutes a bottom surface of the recess 114. But according to this embodiment, a concave is formed in a predetermined area of an upper surface of an upper sheet metal 112a via cutting, punching or pressing to obtain a recess 114-3 so that the recess 114-3 is comprised of only the upper sheet metal 112a.

The LED package 100-3 has the other constructions and effects substantially identical to those of the LED package 100 described above. Therefore the same or corresponding components were given the same reference signs and will not be explained further.

A method for manufacturing the LED package of FIG. 17 will be explained hereunder with reference to FIG. 18.

Figure 18:
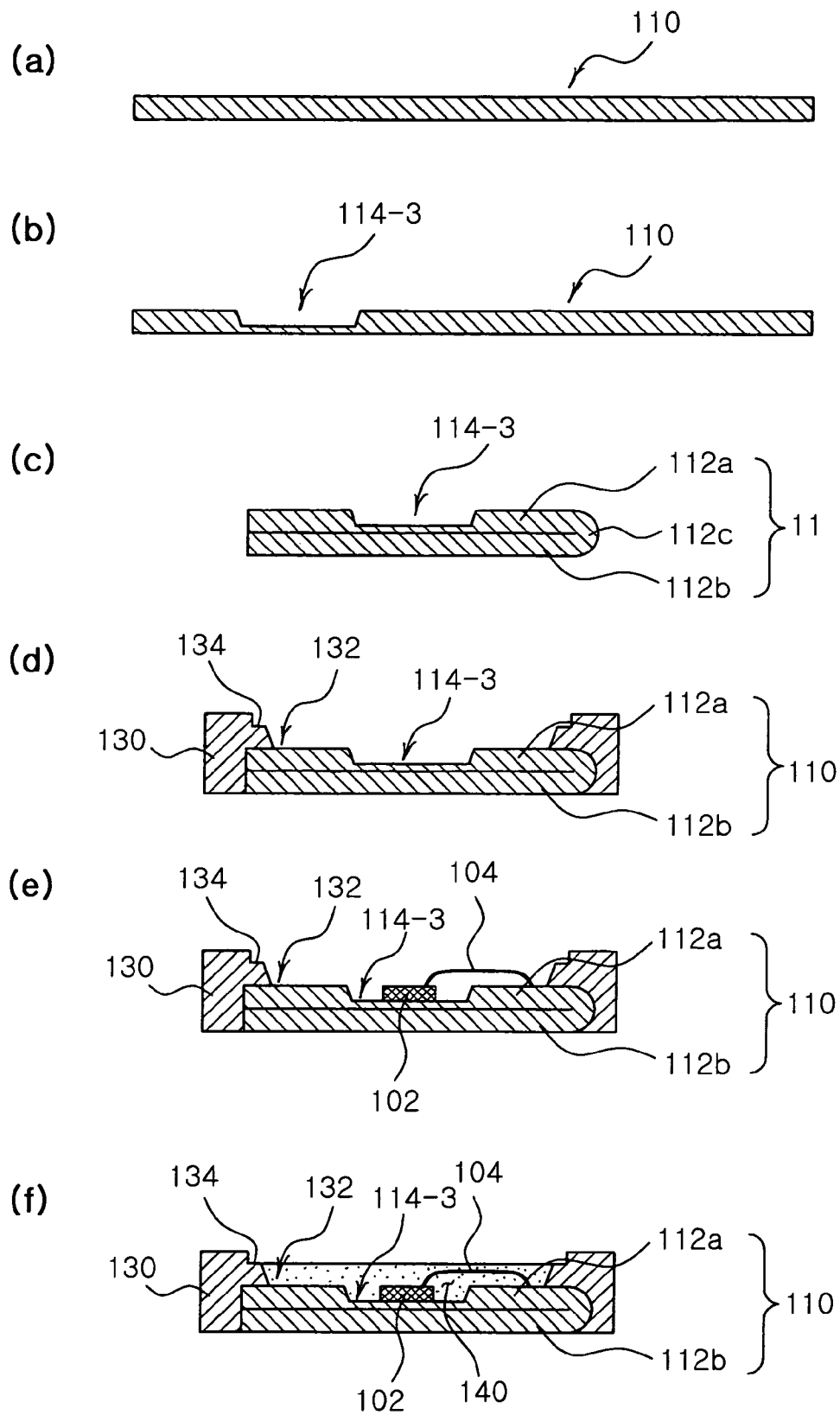
FIG. 18 is a cross-sectional view illustrating a method for manufacturing the LED package according to further another embodiment of the invention.

Processes of FIG. 18 are substantially identical to those of FIG. 10 except that a recess 114-3 is formed via cutting, punching or pressing. More specifically, FIG. 18(*a*) is substantially identical to FIG. 10 (*a*), FIG. 18(*b*) corresponds to FIGS. 10(*b*) and (*c*) in a modified form, and FIG. 18(*c*) to (*f*) are substantially identical to FIG. 10 (*d*) to (*g*).

An LED package 100-4 according to further another embodiment of the invention will be explained hereunder with reference to FIG. 19, which is a cross-sectional view illustrating the LED package according to the embodiment, corresponding to FIG. 3.

Figure 19:
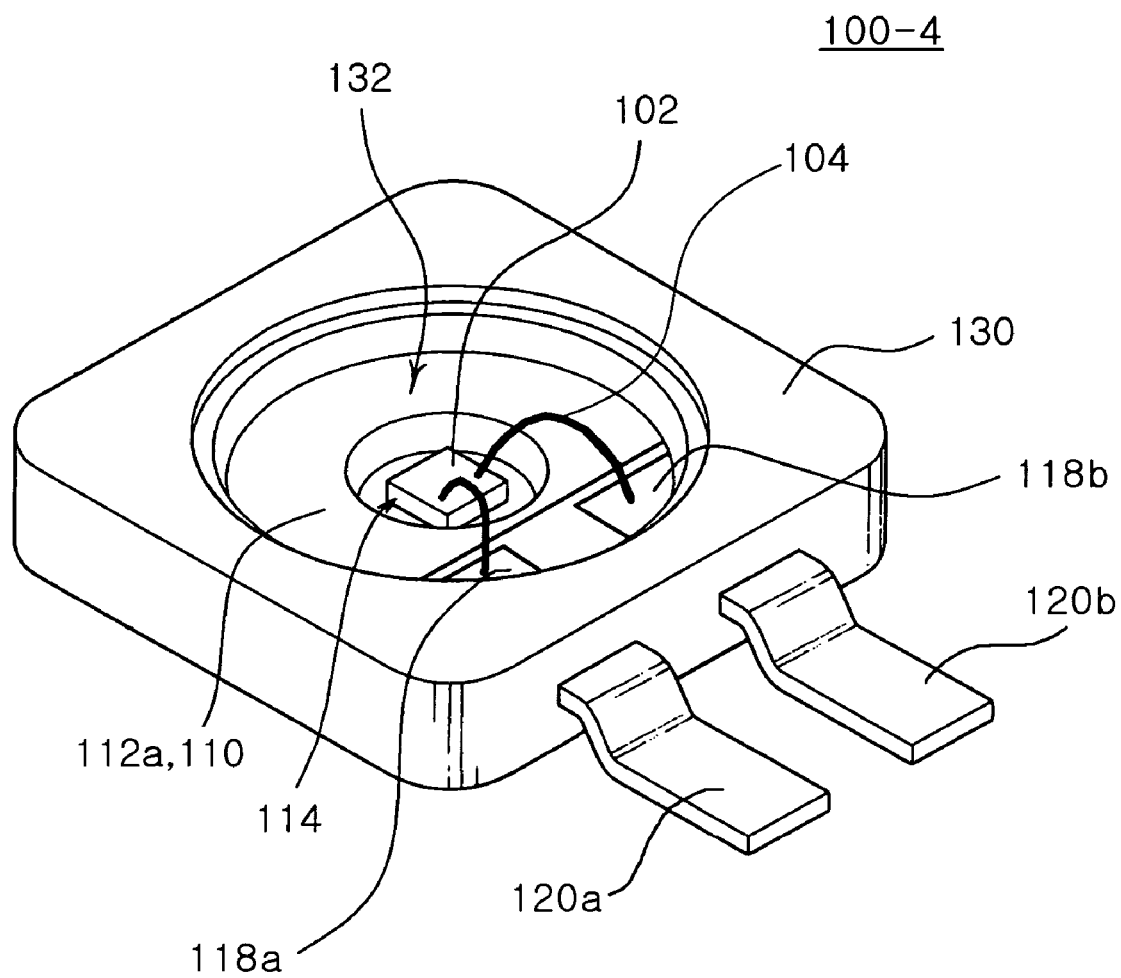
FIG. 19 is a perspective view illustrating an LED package according to another embodiment of the invention.

The LED package 100-4 of FIG. 19 is distinct from the LED package 100 of FIG. 3 in that in the LED package 100-4, first and second leads 120a and 120b are formed at the same side and electric connecting parts 118a and 118b each are connected to an LED chip via wires 104.

Therefore, according to this embodiment, a heat conducting part 110 is not formed integrally with the first and second leads 120a and 120b and also insulated therefrom by a package body 130.

Alternatively, constructions of FIG. 19 and those of FIG. 3 are combinable. That is, an electrode of the LED chip 102 is connected to the first and second leads 120a and 120b of FIG. 19, and the other electrode of the LED chip 102 is connected to the first lead 113 of FIG. 3 via the heat conducting part 110.

Figure 20:
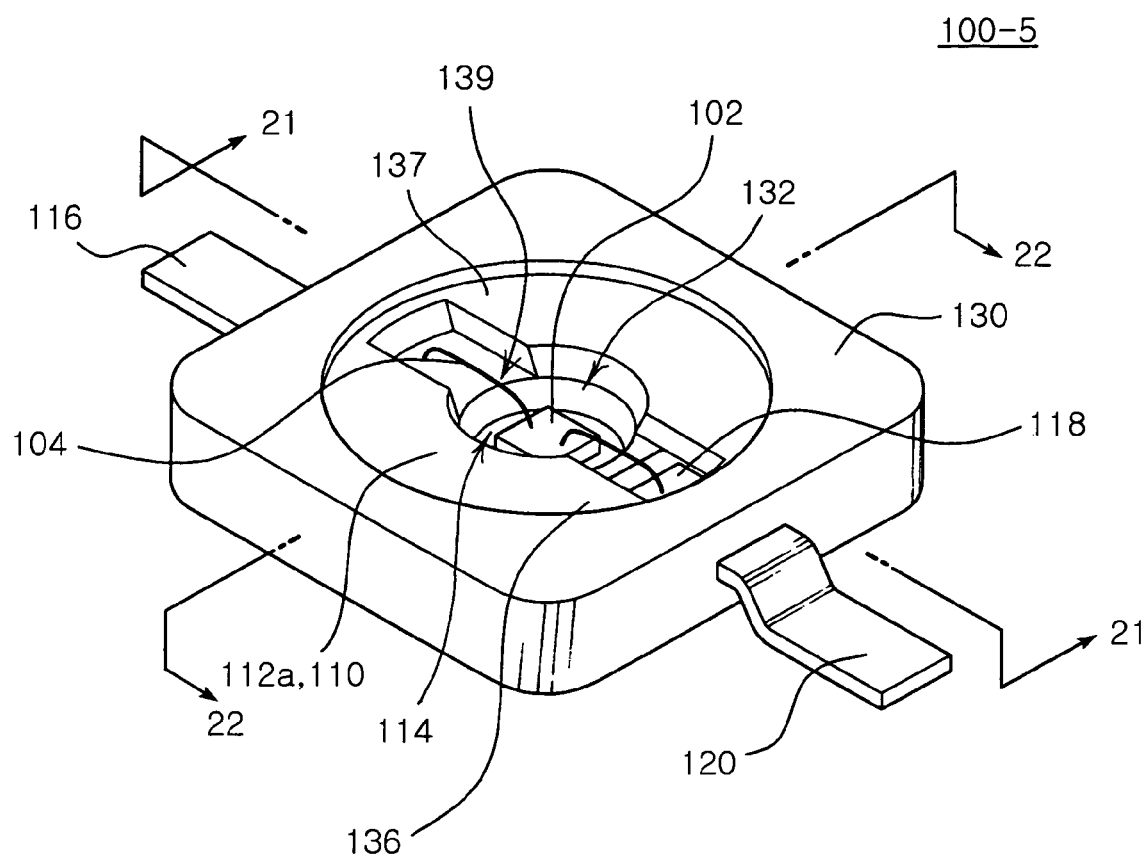
FIG. 20 is a perspective view illustrating an LED package according to further another embodiment of the invention.
Figure 21:
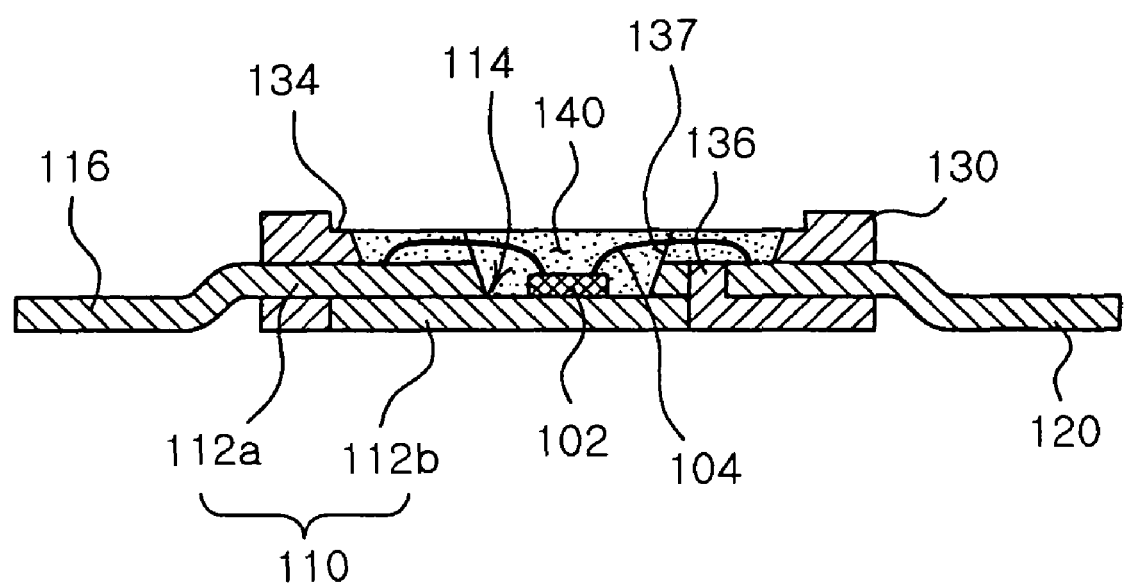
FIG. 21 is a cross-sectional view cut along the line 21-21 of FIG. 20.
Figure 22:
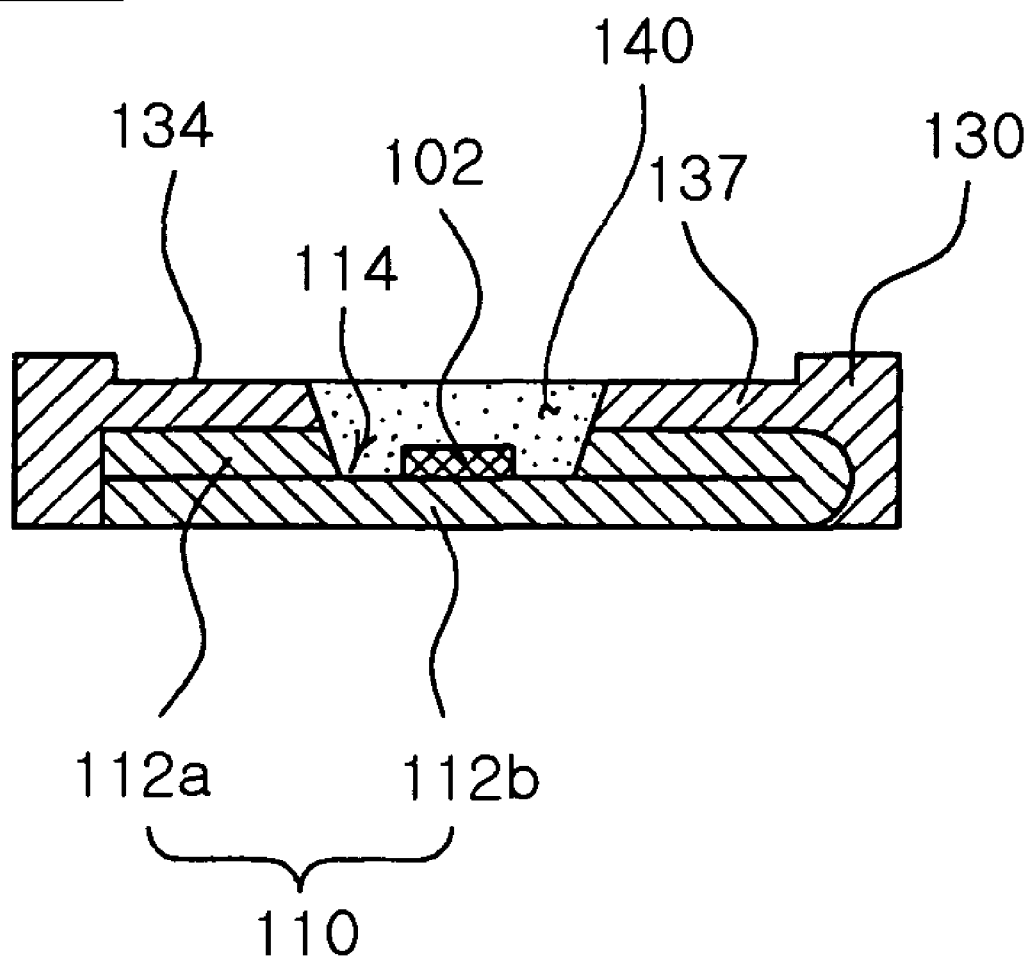
FIG. 22 is a cross-sectional view cut along the line 22-22 of FIG. 20.

An LED package according to further another embodiment of the invention will be explained hereunder with reference to FIGS. 20 to 22, in which FIG. 20 is a perspective view illustrating the LED package according to further another embodiment of the invention, FIG. 21 is a cross-sectional view cut along the line 21-21 of FIG. 20, and FIG. 22 is a cross-sectional view cut along the line 22-22 of FIG. 20.

The LED package 100-5 according to this embodiment includes a heat conducting part 110, a package body 130 and a transparent encapsulant 140. The heat conducting part 110 is comprised of folded sheet metals 112a and 112b and has a recess 114 formed thereon to seat an LED chip 102 therein. The package body 130 houses the heat conducting part 110 and has a recess 132 formed thereon to direct light generated from the LED chip 102 upward. The transparent encapsulant 140 is provided to the recess 114 of the heat conducting part 110 and the recess 132 of the package body 130 to encapsulate the package body 130 and the LED chip 102.

The LED package 100-5 of this embodiment is basically identical to the LED package 100 described above with reference to FIGS. 3 to 6 except for the followings. That is, an upper part 137 of the package body 130 houses mostly an upper sheet metal 112a of a first lead, and a path 139 is formed in the upper part 137 of the package body 130 so that wires 104 can be installed in the upper sheet metal 112a of the first lead and a second lead 120.

This allows light generated from the LED chip 102 to converge upward further, and the upper sheet metal 112a of the first lead to be sealed more securely. In addition, with a smaller-spaced transparent encapsulant 140, the upper part 137 of the package body 130 is in greater contact with a cover or a lens more, which is later placed on an upper surface of the LED package 100-5.

Meanwhile, the components, the same as or corresponding to those of the aforesaid LED package 100 were given the same reference signs and will not be explained further.

Figure 23:
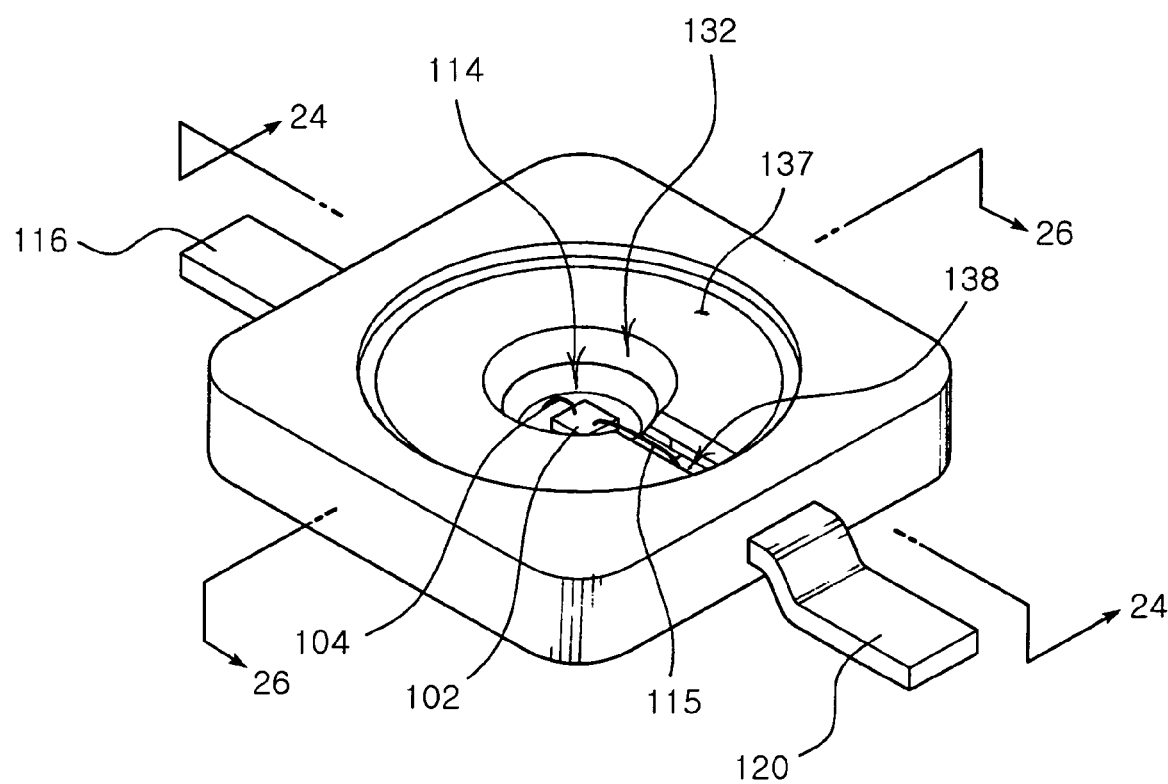
FIG. 23 is a perspective view illustrating an LED package according to still another embodiment of the invention.
Figure 24:
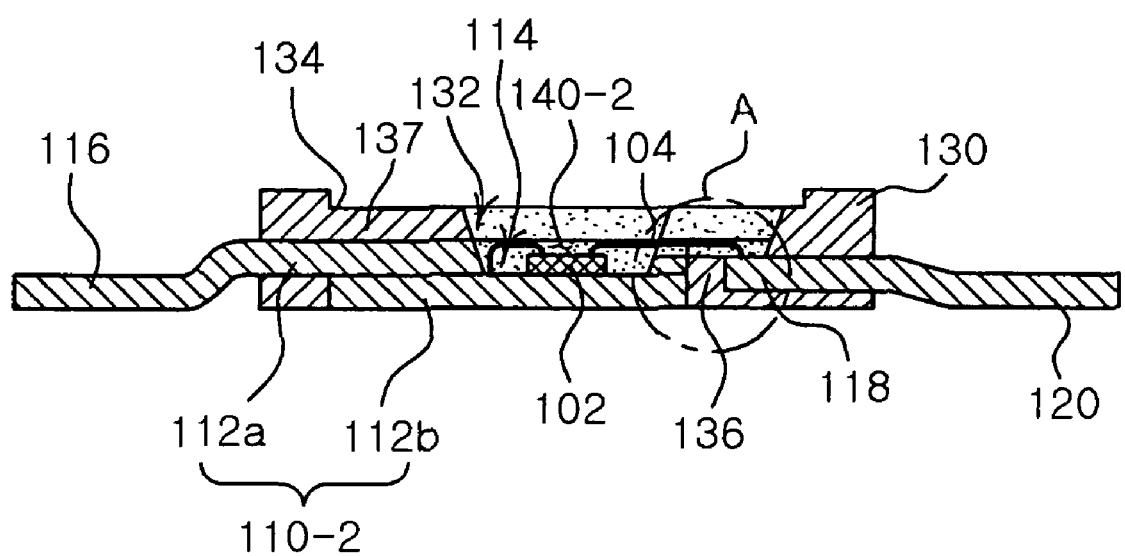
FIG. 24 is a cross-sectional view cut along the line 24-24 of FIG. 23.
Figure 25:
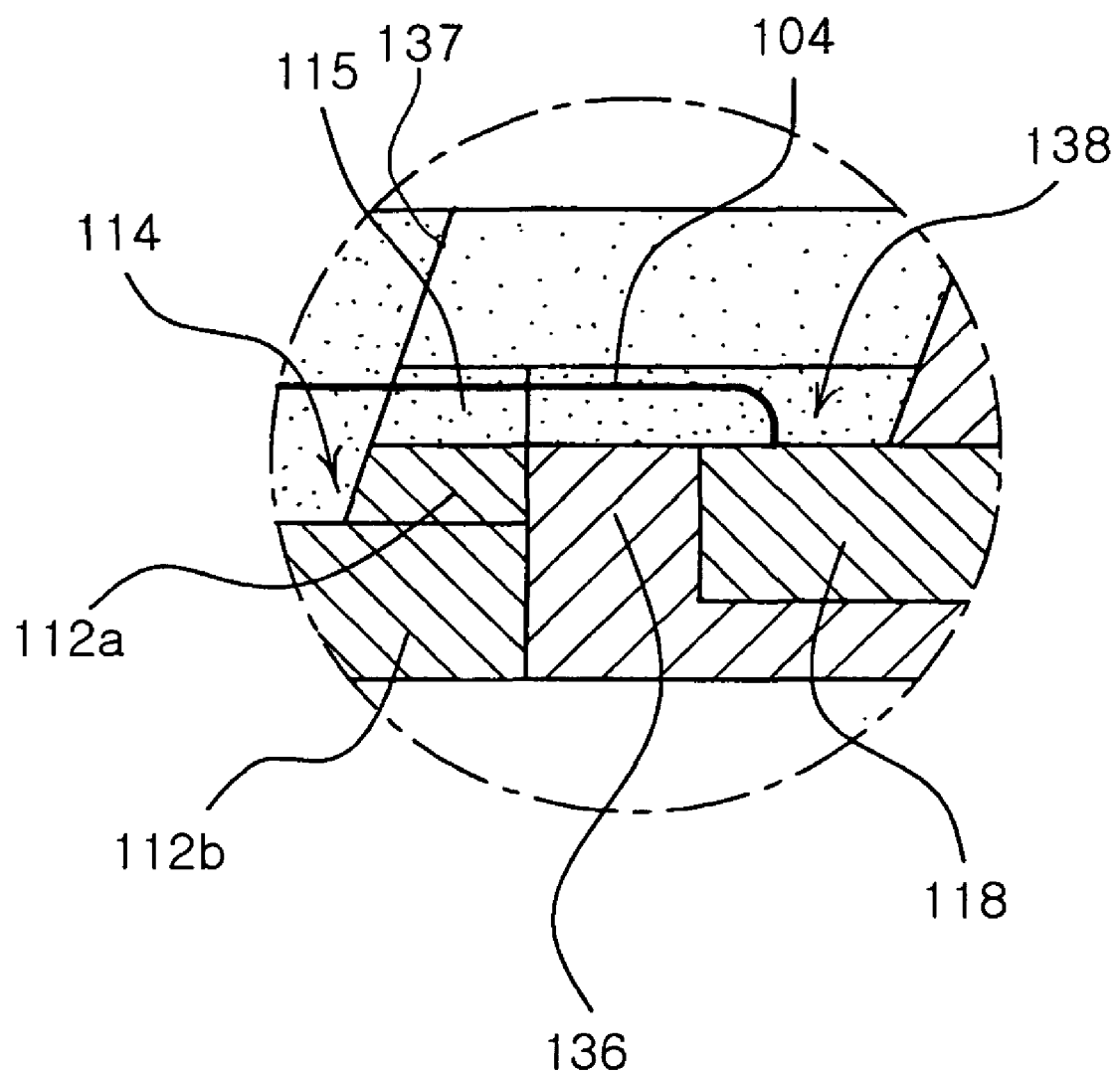
FIG. 25 is a magnified view illustrating an A portion of FIG. 24.
Figure 26:
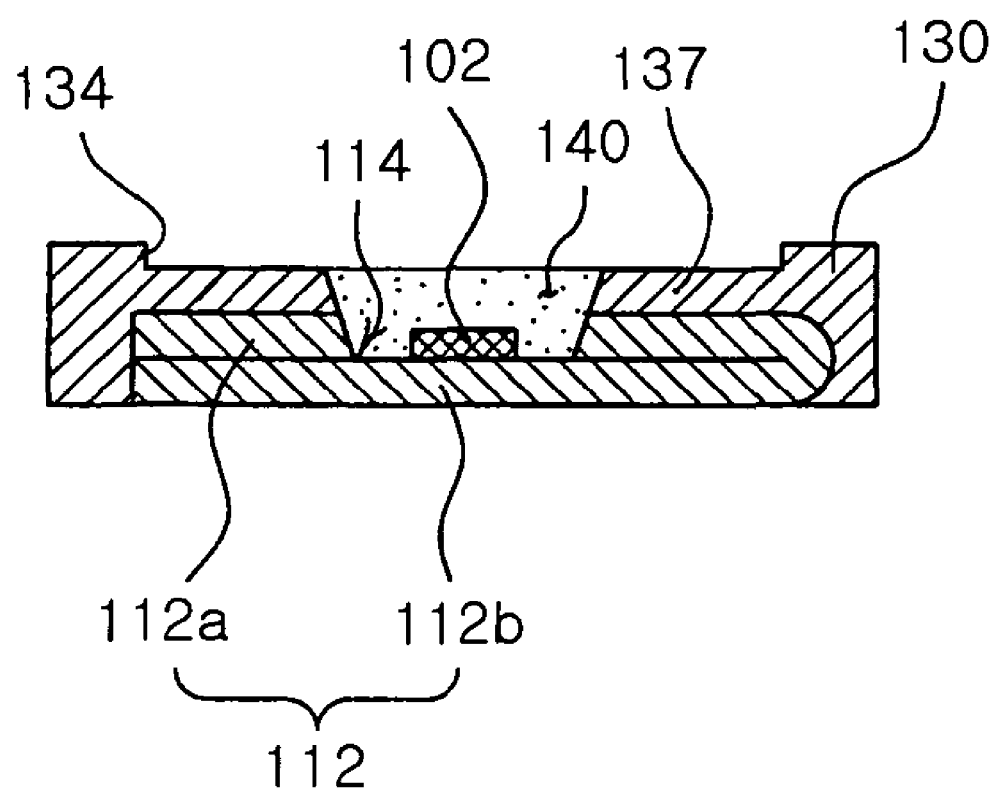
FIG. 26 is a cross-sectional view cut along the line 26-26 of FIG. 23.

An LED package 100-5 according to further another embodiment of the invention will be explained hereunder with respect to FIGS. 23 to 26, in which FIG. 23 is a perspective view illustrating the LED package according to further another embodiment of the invention, FIG. 24 is a cross-sectional view cut along the line 24-24 of FIG. 23, FIG. 25 is a magnified view illustrating an S portion of FIG. 24, and FIG. 26 is a cross-sectional view cut along the line 26-26 of FIG. 23.

The LED package 100-6 according to this embodiment is substantially identical to the LED package 100-2 shown in the LED package 100-2 shown in FIGS. 13 to 15 except that in the LED package 100-6, an upper part 137 of a package body 137 is formed to house mostly an upper sheet metal 112a of a first lead and a second lead 120. Therefore, the same or similar components were given the same reference signs and will not be explained further.

The upper part 137 of the package body 130 is partially cut out to form a path 138 so that wires 104 can be installed in an upper sheet metal 112a of a first lead and a second lead 120.

This allows light generated from the LED chip 102 to converge upward further and the upper sheet metal 112a of the first lead to be housed more securely. Also, with a smaller-spaced transparent encapsulant 140, the upper package body 137 is in greater contact with a cover or a lens, which is later placed on the LED package 100-6.

As set forth above, according to preferred embodiments of the invention, a heat conducting part is formed of a pair of sheet metals, and a recess is formed thereon by perforation or a certain process. This allows light generated from the LED chip to be reflected upward effectively. Furthermore, the sheet metals are folded over to easily produce the heat conducting part, thereby simplifying an overall process. Also, the heat conducting part and the first lead are integrally formed and hardly separated from each other despite external impact applied. According to the invention, mold is placed over the heat conducting part, a package body is formed via injection molding, an LED chip is mounted and a transparent resin is poured to form an encapsulant. In this fashion, the invention ensures an easier manufacturing process.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
    a light emitting diode chip;
    a heat conducting part comprising an upper sheet metal plate and a lower sheet metal plate as a pair of continuously connected sheet metal plate which is folded and laminated vertically by bonding an upper surface of the lower sheet metal plate and a bottom surface of the upper sheet metal plate together, and the heat conducting part having a recess formed on the upper sheet metal plate to seat the light emitting diode chip therein;
    a package body for directing light generated from the light emitting diode chip upward, the package body housing the heat conducting part;
    a transparent encapsulant provided to the recess of the heat conducting part; and
    leads partially housed by the package body to supply power to the light emitting diode, wherein a portion of the upper sheet metal plate extends outside the package body and forms a first lead, thereby forming the heat conducting part and the first lead as one body, and wherein a second lead is insulated from the heat conducting part by an insulating portion of the package body.

2. The light emitting diode package according to claim 1, wherein the package body has a recess formed over the recess of the heat conducting part to partially expose an upper surface of the heat conducting part, wherein the transparent encapsulant is also provided to the recess of the package body.

3. The light emitting diode package according to claim 1, wherein the heat conducting part further comprises a coupling part for coupling folded portions of the heat conducting part, the coupling part formed between the folded portions.

4. The light emitting diode package according to claim 3, wherein the coupling part comprises a weld or a metal inclusion.

5. The light emitting diode package according to claim 4, wherein the weld is formed by at least one selected from a group consisting of resistance welding, hot press welding, ultrasonic welding and high frequency welding.

6. The light emitting diode package according to claim 4, wherein the metal inclusion comprises a coating material or a metal paste.

7. The light emitting diode package according to claim 1, wherein the recess of the heat conducting part comprises a hole formed in an upper one of the folded sheet metals of the heat conducting part.

8. The light emitting diode package according to claim 1, wherein the recess of the heat conducting part comprises a concave formed in an upper one of the folded sheet metals of the heat conducting part.

9. The light emitting diode package according to claim 1, wherein a path is formed in a portion around the light emitting diode chip of the heat conducting part and a portion of the package body adjacent thereto, the path leading from the recess of the heat conducting part to an upper surface of at least one of the electric connecting parts, wherein the light emitting diode chip is connected to the upper surface of the electric connecting part via a wire through the path.

10. The light emitting diode package according to claim 9, wherein the transparent encapsulant is also provided to the path.

11. The light emitting diode package according to claim 10, wherein the package body comprises a recess formed over and around the recess of the heat conducting part to partially expose an upper surface of the heat conducting part, wherein the light emitting diode package further comprises a second transparent encapsulant provided to the recess of the package body.

12. The light emitting diode package according to claim 1, wherein an upper part of the package body above the leads is shaped such that the light emitting diode chip and the leads are electrically connected, the upper part extending to an outer periphery of the heat conducting part.

13. The light emitting diode package according to claim 1, wherein the transparent encapsulant is shaped as an upper hemisphere.

14. A light emitting diode package comprising:
a light emitting diode chip;
a heat conducting part on which the light emitting diode chip is seated, the heat conducting part comprising vertically laminated sheet metal plates;
a package body for directing light generated from the light emitting diode chip upwards, the package body housing the heat conducting part;
a transparent encapsulant provided to cover the light emitting diode chip; and
leads partially housed by the package body to supply power to the light emitting diode, wherein the metal plates are continuously connected with each other as one body and are folded and bonded together between surfaces which face each other, respectively, to form the laminated structure of the heat conducting part, wherein one of the sheet metal plates extends outside the package body and forms a first lead, thereby forming the heat conducting part and the first lead as one body, and wherein a second lead is insulated from the heat conducting part by an insulating portion of the package body.

15. The light emitting diode package according to claim 14, wherein the heat conducting part comprises an upper sheet metal plate and a lower sheet metal plate as a pair of connected sheet metal plates which are folded and laminated vertically.

16. The light emitting diode package according to claim 15, wherein a portion of the upper sheet metal plate extends outside the package body to form the first lead, and an underside surface of the lower sheet metal plate is exposed to the outside through a lower surface of the package body.

17. The light emitting diode package according to claim 15, wherein the heat conducting part further comprises a recess formed on the upper sheet metal plate to seat the light emitting diode chip therein.

18. The light emitting diode package according to claim 17, wherein the recess of the heat conducting part comprises a hole formed in the upper sheet metal plate, and an upper surface of the lower sheet metal plate being exposed through the recess.

19. The light emitting diode package according to claim 17, wherein a path is formed on the upper sheet metal plate of the heat conducting part in a portion facing the second lead and on the package body adjacent thereto, the path leading from the recess of the heat conducting part to an upper surface of the second lead, wherein the light emitting diode chip is connected to the upper surface of the second lead via a wire following the path.

20. The light emitting diode package according to claim 19, wherein the wire is installed to be lower than an upper surface of the upper sheet metal plate of the heat conducting part.

21. The light emitting diode package according to claim 14, wherein the heat conducting part further comprising a coupling part formed between the laminated sheet metal plates.

22. The light emitting diode package according to claim 21, wherein the coupling part comprises a weld or a metal inclusion.

23. The light emitting diode package according to claim 22, wherein the weld is formed by at least one selected from a group consisting of resistance welding, hot press welding, ultrasonic welding and high frequency welding.

24. The light emitting diode package according to claim 22, wherein the metal inclusion comprises a coating material or a metal paste.

* * * * *